(12) United States Patent
Sumita

(10) Patent No.: US 7,923,982 B2
(45) Date of Patent: Apr. 12, 2011

(54) SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 485 days.

(21) Appl. No.: 12/065,468

(22) PCT Filed: Aug. 29, 2006

(86) PCT No.: PCT/JP2006/316930
§ 371 (c)(1),
(2), (4) Date: Feb. 29, 2008

(87) PCT Pub. No.: WO2007/026670
PCT Pub. Date: Mar. 8, 2007

(65) Prior Publication Data
US 2009/0230947 A1 Sep. 17, 2009

(30) Foreign Application Priority Data
Sep. 2, 2005 (JP) .................................. 2005-254974

(51) Int. Cl.
H03K 5/12 (2006.01)
H03L 5/00 (2006.01)

(52) U.S. Cl. ............................ 324/72; 327/170; 327/333

(58) Field of Classification Search .................... 324/72; 327/170, 333
See application file for complete search history.

(56) References Cited

U.S. PATENT DOCUMENTS

| 5,949,249 | A * | 9/1999 | Preuss et al. ..................... 326/27 |
| 6,278,305 | B1 * | 8/2001 | Tanaka ........................... 327/170 |
| 6,856,175 | B2 * | 2/2005 | Wodnicki ....................... 327/108 |
| 6,864,731 | B2 * | 3/2005 | Zumkehr et al. ............... 327/170 |
| 6,927,610 | B2 * | 8/2005 | Callahan, Jr. .................. 327/112 |

FOREIGN PATENT DOCUMENTS

| JP | 04-258015 | 9/1992 |
| JP | 11-112347 | 4/1999 |
| JP | 11-317649 | 11/1999 |

* cited by examiner

*Primary Examiner* — Timothy J Dole
*Assistant Examiner* — Farhana Hoque
(74) *Attorney, Agent, or Firm* — McDermott Will & Emery LLP

(57) ABSTRACT

A semiconductor integrated circuit is provided with a voltage level detector which detects a voltage level of a signal wire, and a transition time detector which detects a time length of a transition period during which the signal wire changes from an inactive voltage state to an active voltage state based on the voltage level detected by the voltage level detector. The voltage level detector detects the voltage level of the signal wire during the transition period.

54 Claims, 33 Drawing Sheets

F I G. 1
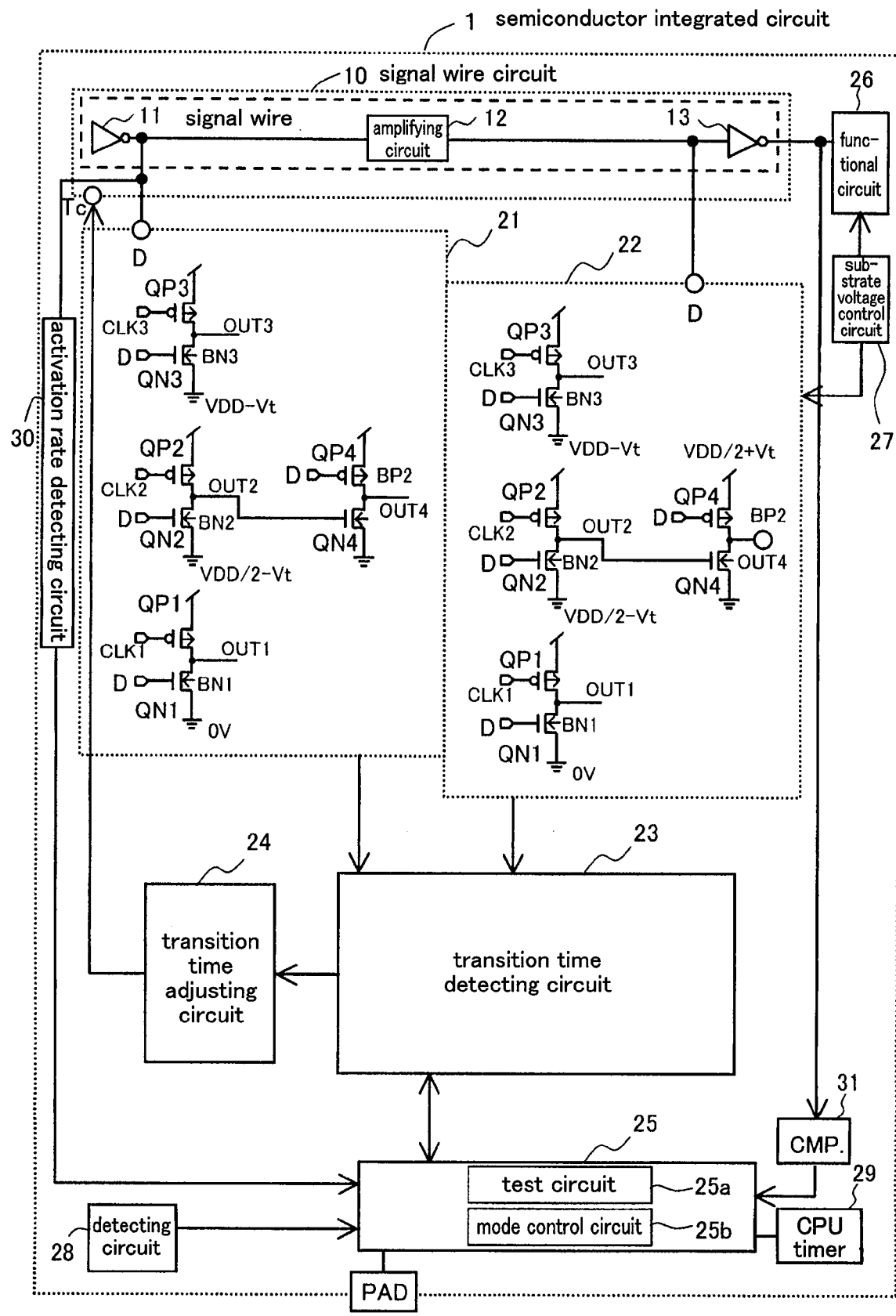

F I G. 2
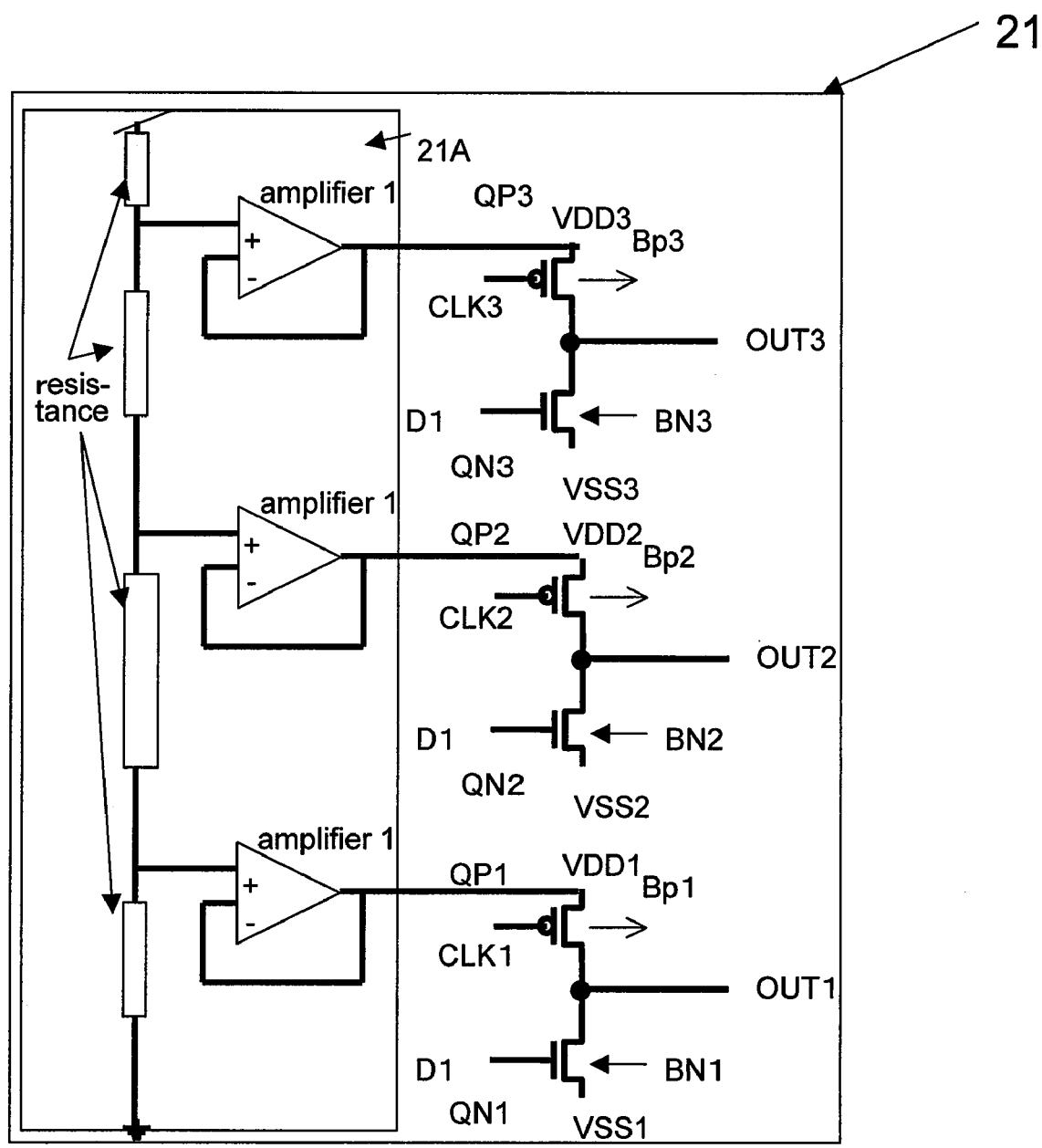

F I G. 1 1 A
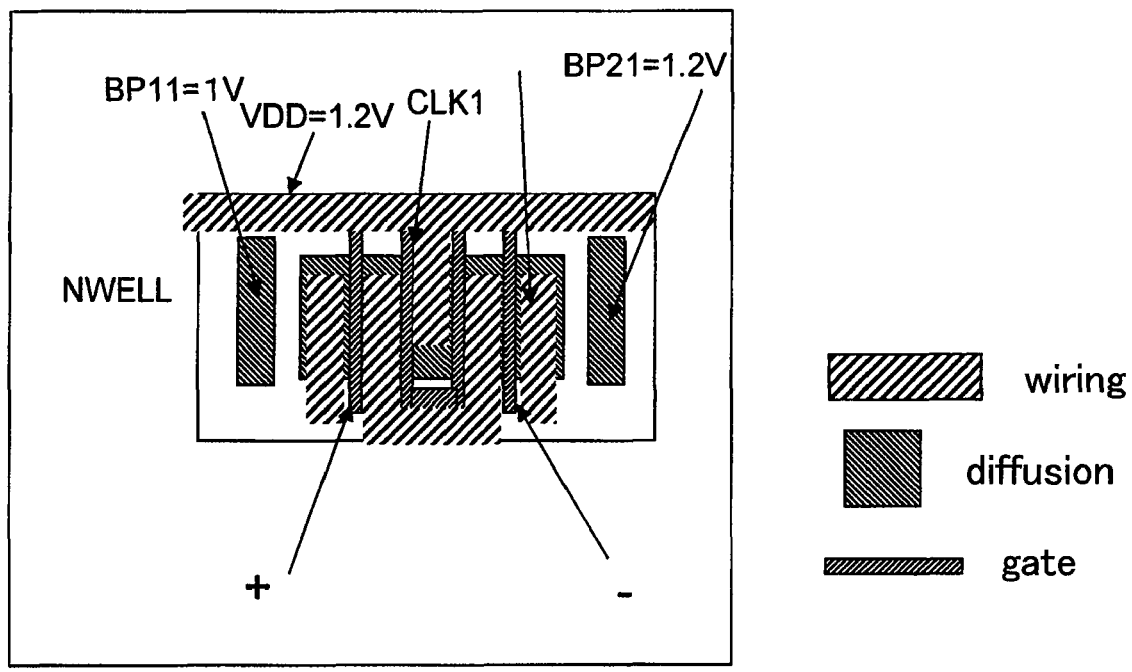
F I G. 1 1 B
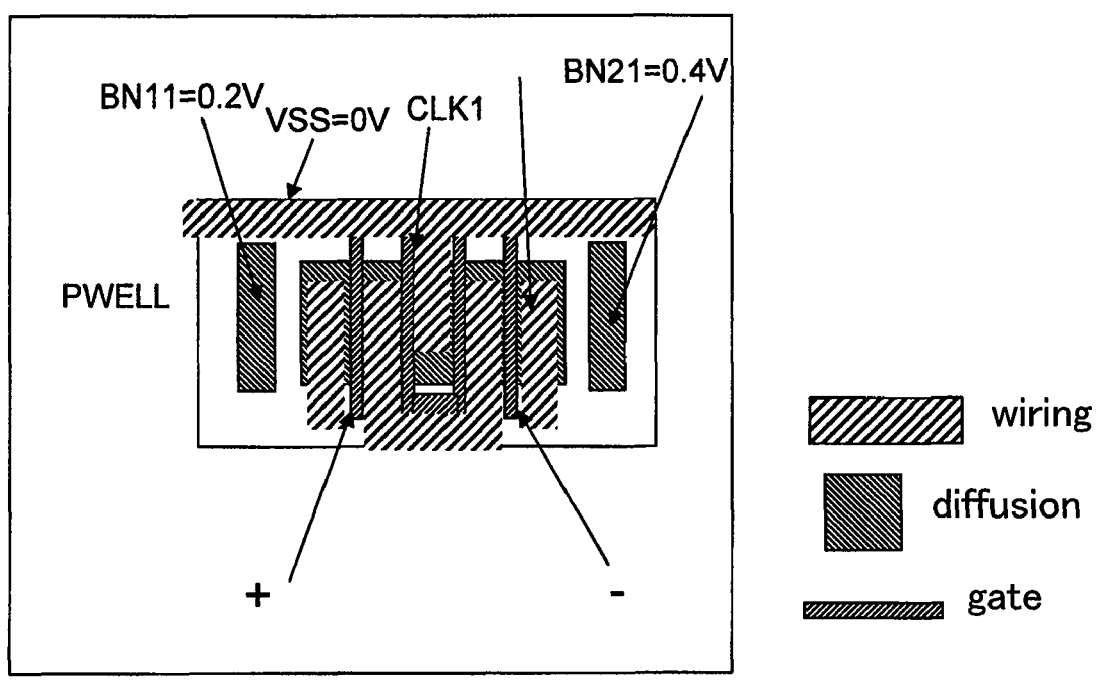

F I G. 1 6
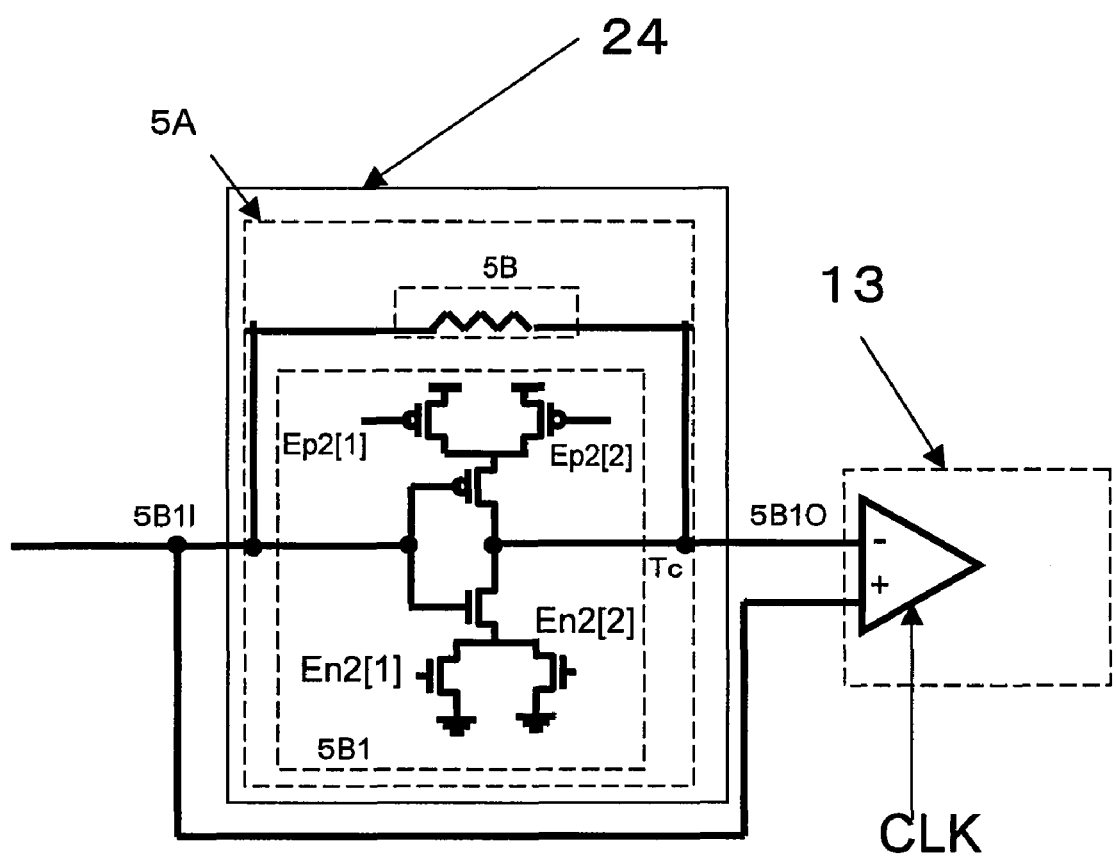

F I G. 1 7
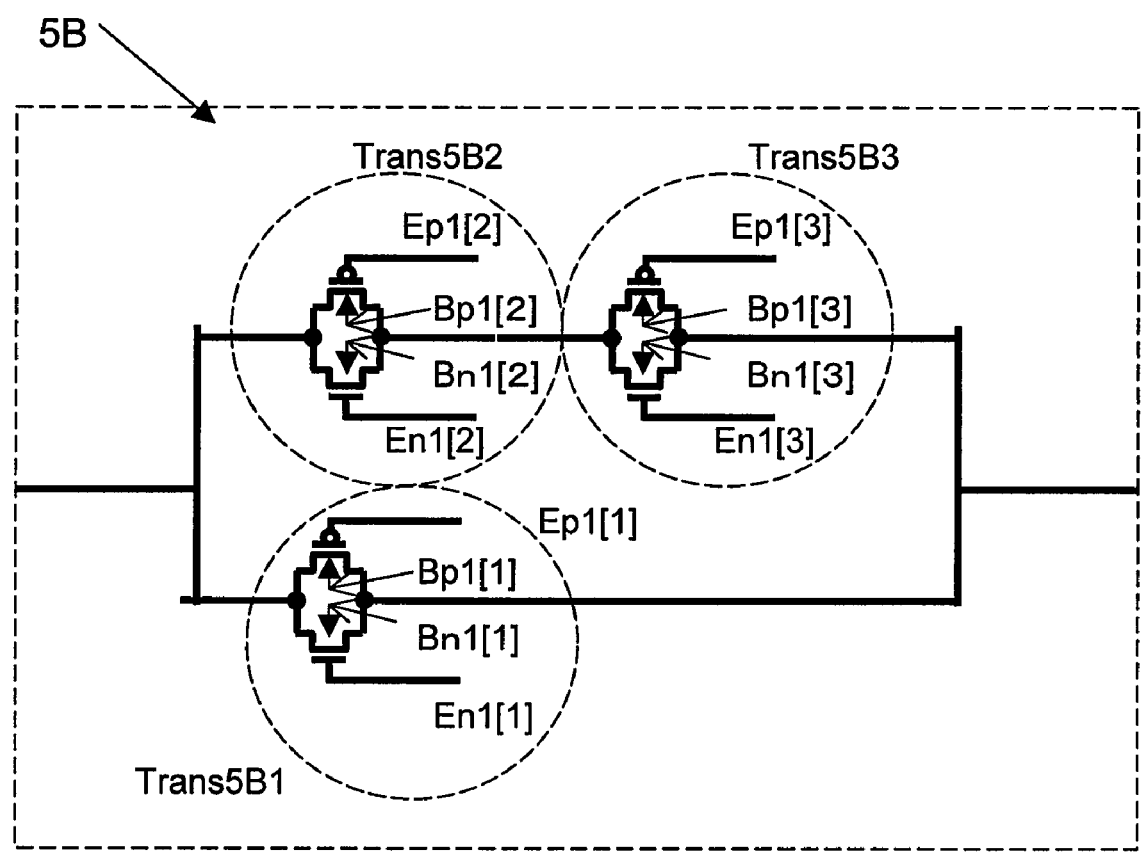

F I G. 1 9
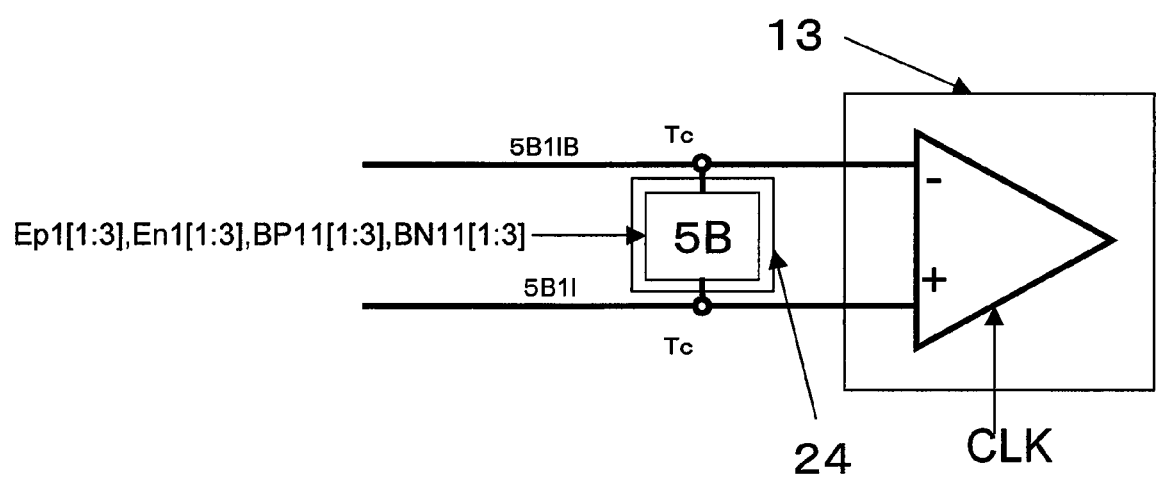

F I G. 2 3
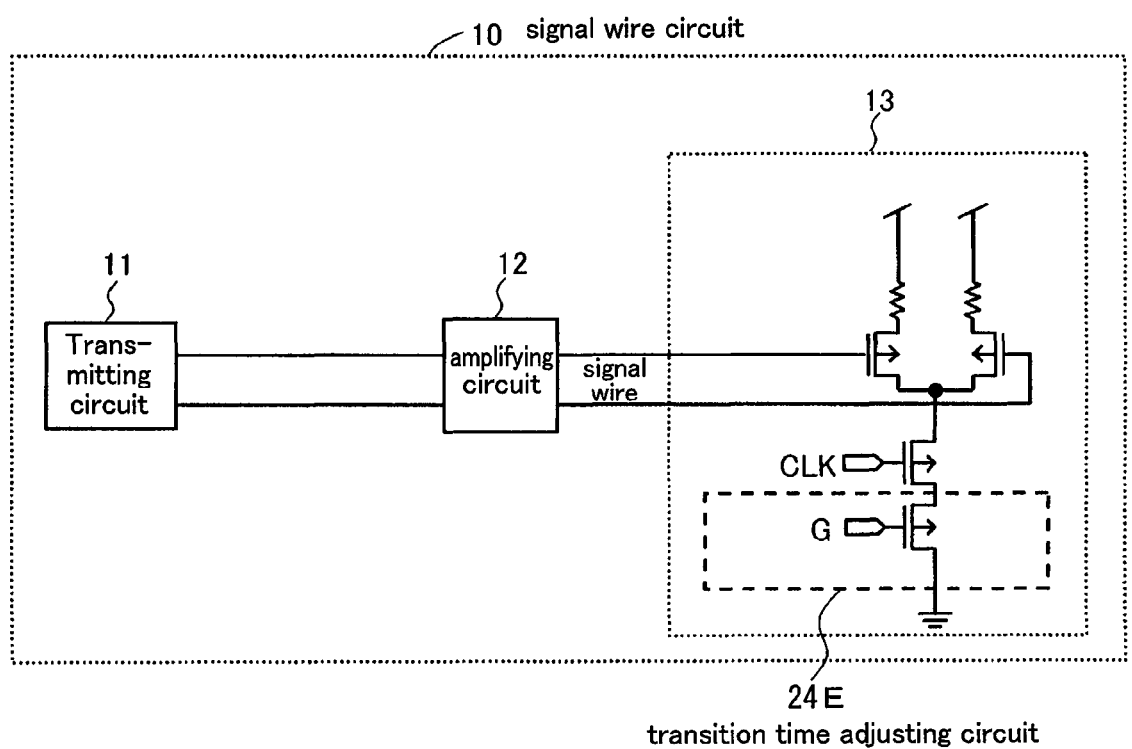
24 E
transition time adjusting circuit

F I G. 2 5
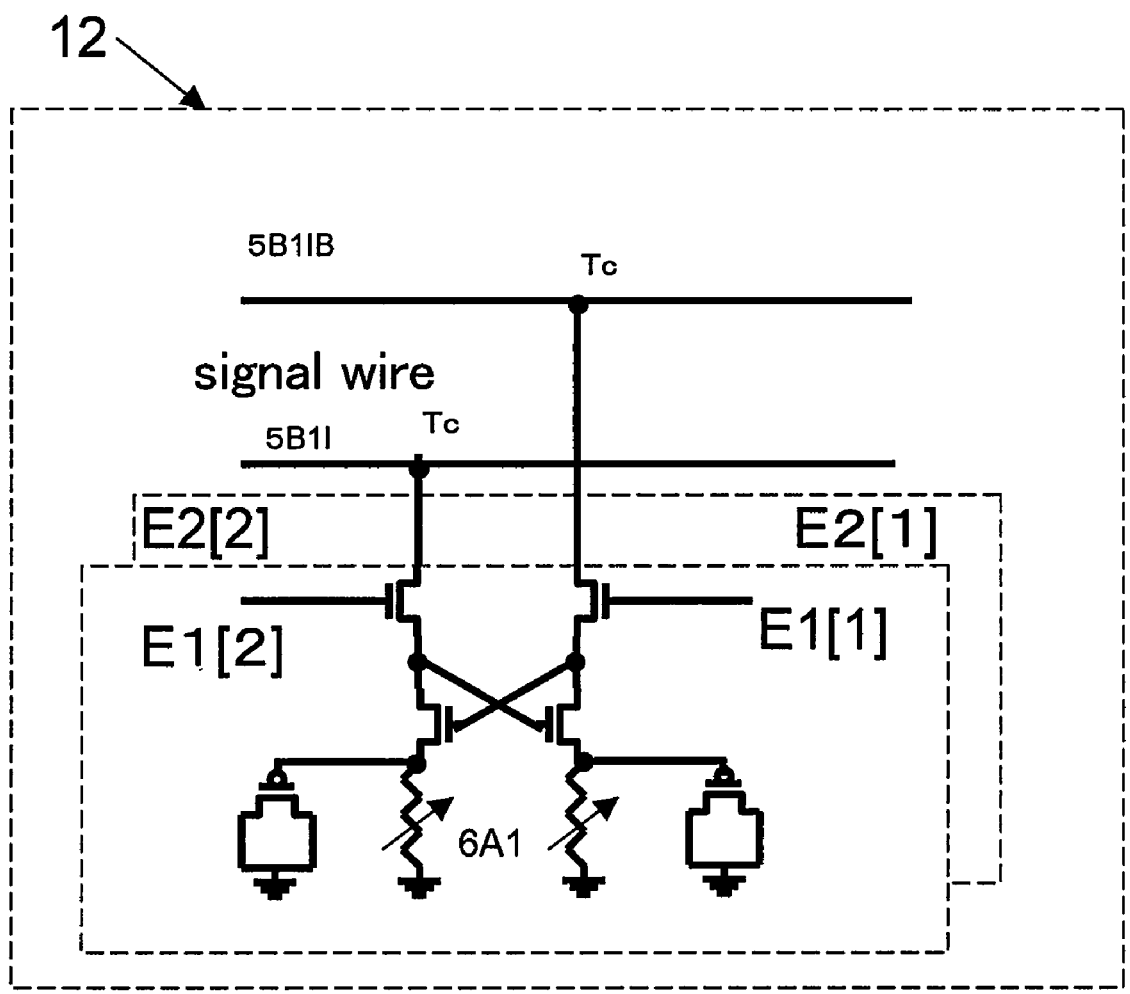

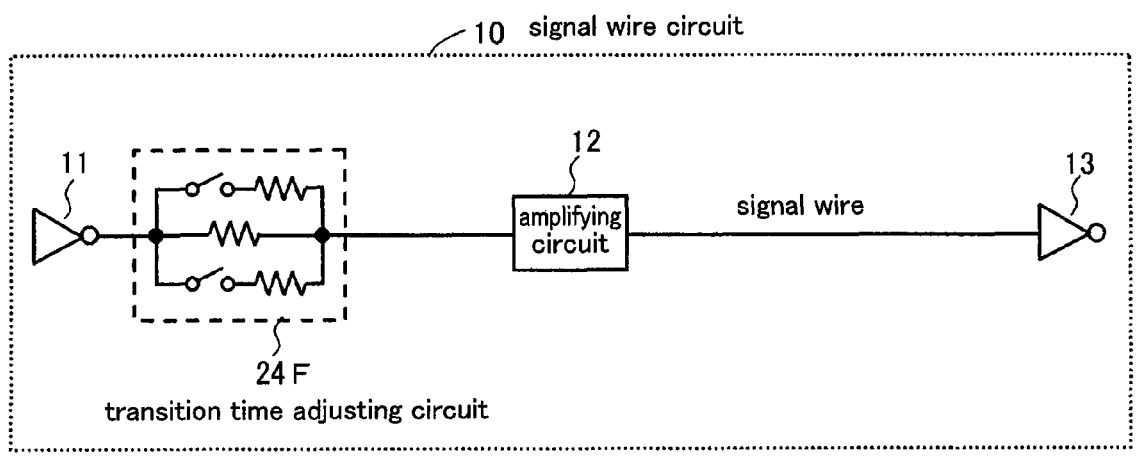
F I G. 2 7

F I G. 2 9
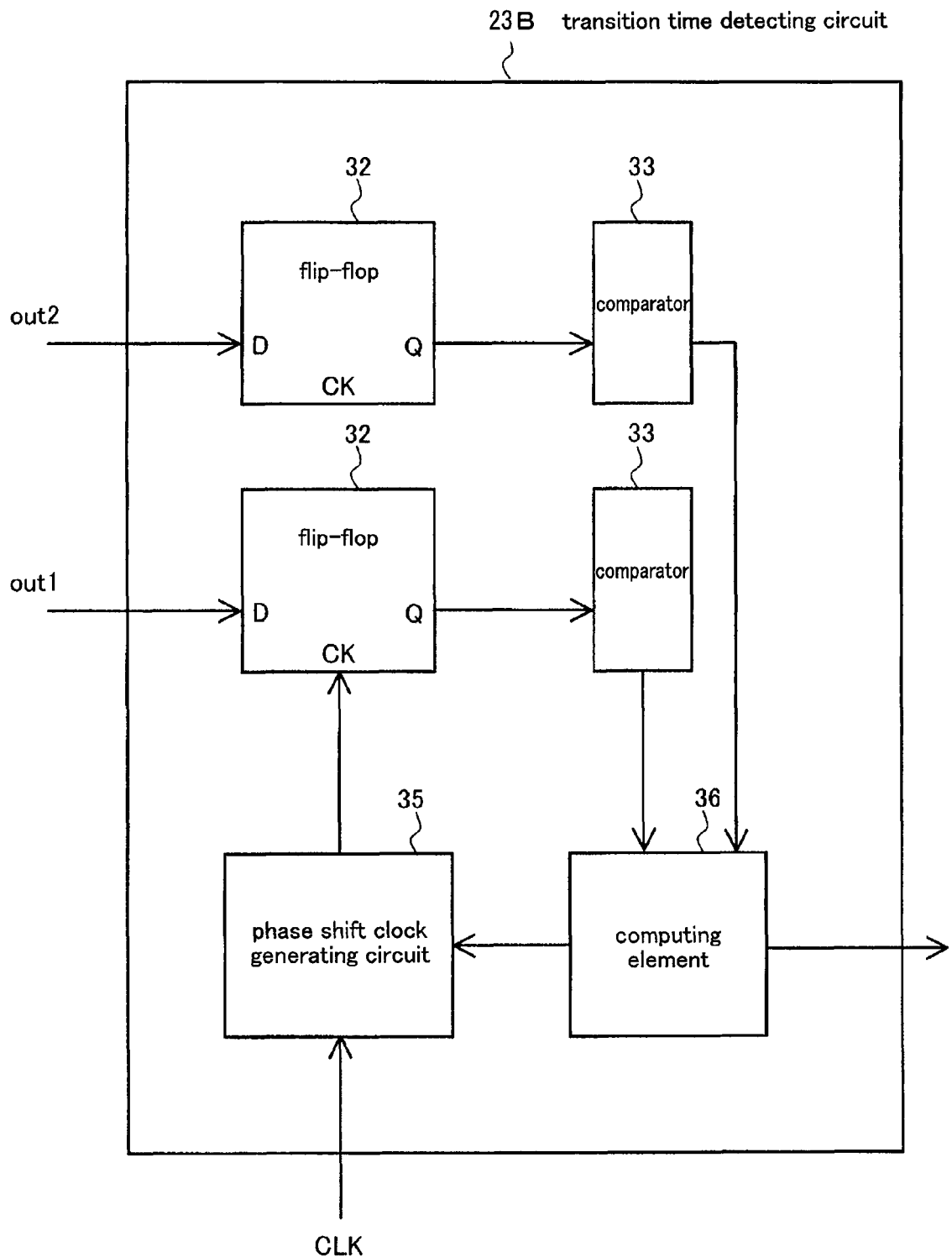

SEMICONDUCTOR INTEGRATED CIRCUIT

RELATED APPLICATIONS

This application is the U.S. National Phase under 35 U.S.C. §371 of International Application No. PCT/JP2006/316930, filed on Aug. 29, 2006, which in turn claims the benefit of Japanese Application No. 2005-254974, filed on Sep. 2, 2005, the disclosures of which Applications are incorporated by reference herein.

FIELD OF THE INVENTION

The present invention relates to a semiconductor integrated circuit, more particularly to a technology for detecting a tilt of a signal waveform of a signal wire.

BACKGROUND OF THE INVENTION

In a conventional method of detecting a tilt of a signal waveform of an output signal wire in a semiconductor integrated circuit, an arrival time on the "L"-level side of the signal waveform and an arrival time on the "H"-level side thereof are detected by a comparator, and a transition time thereby obtained is converted into the tilt of the waveform as recited in the Patent Document 1.
Patent Document 1: FIGS. 1-3 of the US Patent Document (U.S. Pat. No. 6,278,305)

DISCLOSURE OF THE INVENTION

Problem to be Solved by the Invention

However, the conventional method of detecting the tilt of the waveform and correcting the waveform based on the detected tilt has two problems. One of them is that the transition time is falsely recognized when an abnormal waveform is generated due to the crosstalk (unintended reverse transition, glitch (whisker-like pulse) or the like) or the like. The other is that an error is caused in the tilt of the waveform due to an excessive response time of the comparator itself resulting from variability in the manufacturing process.

Therefore, a main object of the present invention is to provide a semiconductor integrated circuit in which the transition time is not falsely recognized and any error is not caused in the tilt of the waveform when the tilt of the signal waveform is detected and the waveform is corrected based on the detection result.

Means for Solving the Problem

In order to achieve the foregoing problem, a semiconductor integrated circuit according to the present invention comprises:
a signal wire;
a voltage level detector for detecting a voltage level of the signal wire; and
a transition time detector for detecting a time length of a transition period during which the signal wire changes from an inactive voltage state to an active voltage state based on the voltage level detected by the voltage detector, wherein
the voltage level detector detects the voltage level of the signal wire during the transition period. Accordingly, a tilt of a signal waveform of the signal wire can be accurately detected.

The transition time detector preferably further judges whether or not a reverse transition is generated during the transition period based on the voltage level detected by the voltage level detector. Accordingly, such an abnormal state as the reverse transition of the waveform, which is unintentionally generated, can also be detected.

The signal wire transition time detector preferably comprises at least an NMOS transistor, wherein
the signal wire is connected to a gate of the NMOS transistor, a first voltage is connected to a source of the NMOS transistor, and a voltage larger than the first voltage is set to a drain of the NMOS transistor prior to the transition period during which the signal wire changes from the inactive voltage state to the active voltage state,
the voltage level detector detects the drain voltage of the NMOS transistor during the transition period, and
the signal wire transition time detector detects the time length of the transition period based on the drain voltage detected by the voltage level detector. Accordingly, the tilt of the signal waveform of the signal wire can be accurately detected.

A substrate voltage of the NMOS transistor is preferably set so that a threshold value thereof shows a desired value. Accordingly, the tilt of the signal waveform of the signal wire in a defined arbitrary voltage range can be accurately detected.

The substrate voltage value of the NMOS transistor is preferably set by a substrate voltage value supplied from a substrate contacts sandwiching the NMOS transistor on a well on which the transistor is formed. Accordingly, it becomes unnecessary to separate the wells on which the NMOS transistors are formed, and the substrate voltage value of each NMOS can be set. As a result, a circuit area on the semiconductor substrate can be reduced.

The voltage level detector preferably comprises:
a PMOS transistor in which a second voltage is set to its source, a voltage lower than the second voltage is set to its drain before the transition period starts, and the signal wire is connected to its gate; and
an NMOS transistor in which the drain of the PMOS transistor is connected to its drain and the drain of the NMOS transistor is connected to its gate, wherein
the voltage level detector detects the drain voltage of the PMOS transistor during the transition period, and
the transition time detector detects the time length of the transition period based on the drain voltage of the PMOS transistor detected by the voltage level detector and judges whether or not the reverse transition is generated during the transition period. Accordingly, the tilt of the signal waveform of the signal wire can be accurately detected, and the abnormal state such as the reverse transition of the waveform, which is unintentionally generated, can be detected.

A substrate voltage of the PMOS transistor is preferably set so that a threshold value thereof shows a desired value. Accordingly, the tilt of the signal waveform of the signal wire can be accurately detected, and the tilt of the actual waveform can be accurately corrected and changed into that of a defined waveform.

The voltage level detector preferably comprises at least an NMOS transistor in which the signal wire is connected to a gate and a substrate voltage is controllable. Accordingly, the tilt of the signal waveform of the signal wire can be accurately detected. Further, the abnormality such as the reverse transition of the waveform, which is unintentionally generated, can be detected, and further, the tile of the waveform in the reverse transition in the defined arbitrary voltage range can be accurately detected.

The semiconductor integrated circuit preferably further comprises a transition time adjuster for adjusting the transition time of the signal waveform of the signal wire based on a result of the detection by the transition time detector. Accordingly, the tilt of the signal waveform of the signal wire can be accurately detected, and the tilt of the actual waveform can be accurately corrected and changed into that of the defined waveform.

The "defined waveform" and the "defined arbitrary voltage range" recited in the foregoing description are defined by a person engaged in the designing process of the semiconductor integrated circuit. These definitions show various values which are considered to be optimal in terms of the design when the semiconductor integrated circuit for which the present invention is implemented is driven.

The transition time adjuster can be variously constituted. An example is that the transition time adjuster preferably adjusts the transition time by adjusting a sensitivity of a receiver of the signal wire. Accordingly, the sensitivity on the receiver side corresponding to the tilt of the actual waveform can be adjusted, which prevents the occurrence of an error in the reception of the waveform. A differential circuit, for example, constitutes the receiver.

The receiver of the signal wire preferably comprises:
a plurality of registers synchronizing with each other by a first clock;
a first counter for making a count by the first clock;
a second counter for fetching a value of the signal wire into one of the plurality of registers by an output of the first counter and making a count by a second clock; and
a selector circuit for selecting one of outputs of the plurality of registers using the second counter, wherein
an MSB value of the second counter is adjusted in accordance with a delay value of the signal wire. Accordingly, a high speed transmission can be realized in the signal wire without any increase of the latency (transmission delay, which is a length of waiting time of CPU arising when an access is made to a memory).

The differential circuit preferably comprises at least two MOS transistors in which their gates are connected to the signal wire, wherein substrate voltage values of the MOS transistors are set by substrate voltage values supplied from substrate contacts sandwiching the NMOS transistors on wells on which the NMOS transistors are formed. Accordingly, it becomes unnecessary to separate the wells on which the MOS transistors are formed, and the substrate voltage value of each MOS can be set. As a result, the circuit area can be reduced.

The transition time adjuster preferably adjusts the transition time by adjusting a sensitivity of an amplifier connected to the signal wire. Accordingly, it becomes unnecessary to correct a transmission driver, which favorably reduces a length of the signal wire. Further, the area and the power consumption can be lessened, and the adjustment can be realized at a higher speed.

The amplifier is preferably cut off when a transfer frequency of the signal wire is at most an arbitrary frequency value. Accordingly, it becomes unnecessary for the amplifier to be intentionally operated when the frequency is low, which reduces the power consumption.

A terminal resistance of the receiver is preferably cut off when a transfer frequency of the signal wire is at most an arbitrary frequency value. Accordingly, it becomes unnecessary for the terminal resistance to be intentionally cut off when the frequency is low. As a result, the generation of the DC current can be prevented, which reduces the power consumption.

The transition time adjuster preferably adjusts the transition time by adjusting the product of a resistance value and a capacitance value of the signal wire. Accordingly, the tilt of the actual waveform can be accurately corrected in such a manner that a width of the adjustment to the defined waveform is extended.

The transmission-side drive performance adjuster preferably adjusts a signal transfer time in accordance with a data transition state on the transmission side. Accordingly, the signal transfer time is different depending on a data transfer frequency, which allows the frequency to be modulated. As a result, the transmission in the signal wire can achieve a higher speed.

The transition time detector preferably comprises:
a phase shift clock generator for generating clocks having phases different to each other;
an information retainer for retaining a result of the detection by the voltage level detector in synchronization with the clock generated by the phase shift clock generator; and
a comparator for comparing the voltage level detection result retained by the information retainer to an expectation value. Accordingly, the tilt of the signal waveform of the signal wire can be accurately detected. Further, any noise during the correction can be blocked, and the tilt of the actual waveform can be accurately corrected and changed into that of the defined waveform at a high speed.

The phase shift clock generator preferably comprises:
a plurality of inverters connected in parallel to each other; and
a selecting circuit for switching outputs of the plurality of inverters by a control signal, wherein
substrate voltage values of MOS transistors of the plurality of inverters are set by substrate voltage values supplied from substrate contacts sandwiching the respective MOS transistors on wells on which the MOS transistors are formed. Accordingly, delay values of the respective inverters can be set by the substrate voltage values set at both ends in a direction of signal transmission. As a result, the delay values of the respective inverters can be finely set in a simple layout design, and the area can be reduced.

The transition time detector preferably comprises a computing element for computing a difference between results of the comparison by the comparator, wherein the transition time detector outputs information relating to a minimum phase difference in which the comparison result by the comparator is favorable. Accordingly, the information from all of the detectors can be processed, as a result of which the tilt of the signal waveform of the signal wire can be accurately and speedily detected. Further, the tilt of the actual waveform can be accurately corrected and changed into that of the defined waveform.

The transition time detector preferably comprises a comparator for comparing a voltage difference between results of the detection by the voltage level detector to a reference voltage value. Accordingly, the present invention can be realized in a simplified configuration.

The signal wire is preferably a clock signal wire. Accordingly, the overhead of an operation frequency of the semiconductor integrated circuit due to the clock skew can be reduced.

The signal wire is preferably a bus line. Accordingly, a high speed transmission on the bus can be realized, and the latency in the bus of the semiconductor integrated circuit can be thereby reduced.

The semiconductor integrated circuit preferably further comprises a receiver of the signal wire, wherein the voltage level detector, the transition time detector and the transition time adjuster execute the processings thereof after the receiver detects any value other than an expectation value.

Accordingly, the power consumption can be reduced because the respective circuit elements are operated only when necessary.

The semiconductor integrated circuit preferably further comprises a memory device for memorizing outputs of the voltage level detector, the transition time detector and the transition time adjuster, wherein the voltage level detector, the transition time detector and the transition time adjuster execute the processing thereof when the semiconductor integrated circuit is subjected to a shipping inspection and store results obtained from the respective processing in the memory device. Accordingly, any factor causing the disturbance of the signal waveform, which deteriorates the yielding percentage, can be adjusted before the semiconductor integrated circuit is actually used.

The voltage level detector, the transition time detector and the transition time adjuster preferably execute the processing thereof when an operation frequency of the signal wire is at least an arbitrary value. Accordingly, the tilt of the waveform is corrected only at any critical timing in a high speed transmission, which reduces the power consumption.

The voltage level detector, the transition time detector and the transition time adjuster preferably execute the processing thereof when an operation frequency of the signal wire is at most an arbitrary value. Accordingly, the delay time can be adjusted in a low speed transmission up to the time in front of the time limit specified by timing restrictions, and the amplitude of the voltage of the signal wire can be thereby reduced. As a result, the power consumption can be curtailed.

The voltage level detector, the transition time detector and the transition time adjuster preferably execute the processing thereof at arbitrary periods after the shipment of the semiconductor integrated circuit. Accordingly, the deterioration of the accuracy of the signal waveform over time in each circuit in relation to the signal wire can be corrected. Further, the correction is intermittently implemented in the semiconductor integrated circuit for the duration of the actual use thereof. As a result, the power consumption can be reduced.

The voltage level detector, the transition time detector and the transition time adjuster preferably execute the processing thereof when a temperature of the semiconductor integrated circuit is at least an arbitrary value. Accordingly, the resistance possibly causing the deterioration of the characteristic of the signal wire and the tilt of the signal waveform resulting from the influence of the transmitter, which may be generated at a high temperature, can be accurately detected. Further, the power consumption can be reduced when the correction is halted at less than a certain temperature.

The voltage level detector, the transition time detector and the transition time adjuster preferably execute the processing thereof when the temperature of the semiconductor integrated circuit is at most an arbitrary value. Accordingly, the resistance possibly sharpening the characteristic of the signal wire and the abnormal transition of the signal waveform resulting from the influence of the transmitter, which may be generated at a low temperature, can be accurately detected. Further, the power consumption can be reduced when the correction is halted at more than a certain temperature.

The voltage level detector, the transition time detector and the transition time adjuster preferably execute the processing thereof when an amplitude voltage of the signal wire is at least an arbitrary value. Accordingly, the resistance possibly sharpening the characteristic of the signal wire and abnormal transition of the signal waveform resulting from the influence of the transmitter, which may be generated at a high voltage, can be accurately detected. Further, the tilt of the signal waveform of the signal wire can be accurately corrected. Further, the power consumption can be reduced when the correction is halted at less than a certain voltage.

The voltage level detector, the transition time detector and the transition time adjuster preferably execute the processing thereof when an amplitude voltage of the signal wire is at most an arbitrary value. Accordingly, the resistance possibly causing the deterioration of the characteristic of the signal wire and the tilt of the signal waveform resulting from the influence of the transmitter, which may be generated at a low voltage, can be accurately detected. Further, the power consumption can be reduced when the correction is halted at more than a certain voltage.

The voltage level detector, the transition time detector and the transition time adjuster preferably execute the processings thereof when an activation rate of the signal wire is at least an arbitrary value. As a result, the power consumption can be reduced when the correction is halted while the activation rate is below a particular value.

The voltage level detector, the transition time detector and the transition time adjuster preferably execute the processing thereof when a functional block relating to the signal wire starts an operation thereof. As a result, these circuit elements can be halted whenever they are unnecessary, and the power consumption can be thereby reduced.

The voltage level detector, the transition time detector and the transition time adjuster are preferably powered off when halted. As a result, the current leakage of these circuit elements can be prevented, and the power consumption can be thereby reduced.

The voltage level detector preferably retains the detection result of the voltage level detector when halted. As a result, the correction information can be transmitted to the transition time adjuster even when these circuit elements are halted, and the power consumption in the transition time adjuster can be reduced.

The semiconductor integrated circuit preferably further comprises:
a pad for external connection; and
a detection result output wire for outputting the detection result of the voltage level detector, wherein
the detection result output wire is connected to the pad. Accordingly, it can be easily inspected before the shipment whether or not these circuit elements are normally operable. As a result, the circuit configurations of these circuit elements can be trimmed so that they are normally operable.

The voltage level detector, the transition time detector and the transition time adjuster each preferably comprise a self-test function in the semiconductor integrated circuit. Accordingly, it can be easily inspected at a high speed whether or not these circuit elements are normally operable before the correction of the transition time of the signal waveform of the signal wire. As a result, the circuit configurations of these circuit elements can be trimmed so that they are normally operable.

The semiconductor integrated circuit preferably further comprises a receiver of the signal wire, wherein
the voltage level detector, the transition time detector and the transition time adjuster adjust the receiver and are provided at a position near the receiver. Accordingly, an instruction for the correction from the receiver can be speedily transmitted. Further, the area overhead of the signal wire can be reduced, which results in the reduction of the power consumption.

The semiconductor integrated circuit preferably further comprises a transmitter of the signal wire, wherein
the voltage level detector, the transition time detector and the transition time adjuster adjust the transmitter and are provided at a position near the transmitter. Accordingly, an instruction for the correction from the transmitter can be speedily transmitted. Further, the area overhead of the signal wire can be reduced, which results in the reduction of the power consumption.

The semiconductor integrated circuit preferably further comprises a transmitter/receiver of the signal wire, wherein the voltage level detector, the transition time detector, the transition time adjuster, and the transmitter/receiver use a common power supply voltage. Accordingly, the area overhead of a power supply line exclusively used for these circuit elements can be reduced, which facilitates a physical layout design.

The semiconductor integrated circuit preferably further comprises a substrate voltage controller for supplying a substrate voltage to a functional block relating to the signal wire, wherein an output voltage of the substrate voltage controller is used as the substrate voltage of the MOS transistor. Accordingly, the area overhead of the substrate voltage controller exclusively used for these circuit elements and the substrate signal wire can be reduced. As a result, the power consumption can be reduced.

The present invention is constituted as follows from a different aspect. A semiconductor integrated circuit according to the present invention comprises:

a signal wire;

a clock generator for generating a plurality of clocks having an arbitrary phase difference therebetween; and a plurality of amplifying circuits for comparing reference voltages to a voltage value of the signal wire in synchronization with one of the plurality of clocks, wherein the reference voltage values of the amplifying circuits are different to each other. Accordingly, it can be checked whether or not a potential of the signal wire is within the clock phase difference arbitrarily set, during the transition of the signal wire.

The semiconductor integrated circuit preferably further comprises a comparing circuit for checking whether or not output values of the plurality of amplifying circuits are consistent with an expectation value. Accordingly, it can be judged whether or not the voltage value of the signal wire exceeds the reference voltages of the amplifying circuits at each time. As a result, it can be checked whether or not the tilt of the waveform of the signal wire is within the clock phase difference arbitrarily set.

EFFECT OF THE INVENTION

According to the present invention, the voltage level of the signal wire is detected by the voltage level detector, the transition time for the signal wire to change from the inactive voltage state to the active voltage state and the presence or absence of the reverse transition during the transition are detected by the transition time detector based on the information from the voltage level detector, and the transition time of the signal waveform of the signal wire is adjusted by the transition time adjuster based on the information from the transition time detector. According to the present invention, therefore, the tilt of the signal waveform of the signal wire can be accurately detected, and such an abnormal state as the unintended reverse transition of the waveform can also be detected. Further, the tilt of the actual waveform can be accurately corrected and changed into that of the defined waveform.

BRIEF DESCRIPTION OF THE DRAWINGS

FIG. 1 is a circuit diagram illustrating a constitution of a semiconductor integrated circuit according to a preferred embodiment of the present invention.

FIG. 2 shows an example of details of a voltage level detecting circuit according to the preferred embodiment.

FIG. 11A shows a first example of the layout of the differential amplifying circuit according to the preferred embodiment.

FIG. 11B shows a second example of the layout of the differential amplifying circuit according to the preferred embodiment.

FIG. 16 shows an example of a receiving circuit according to the preferred embodiment.

FIG. 17 shows an example of the receiving circuit according to the preferred embodiment.

FIG. 19 shows an example of the receiving circuit according to the preferred embodiment.

FIG. 23 is a circuit diagram illustrating an example of a transition time adjusting circuit capable of adjusting a sensitivity of the receiving circuit of the signal wire according to the preferred embodiment.

FIG. 25 shows an example of the amplifying circuit according to the preferred embodiment.

FIG. 27 is a circuit diagram illustrating an example of a transition time adjusting circuit capable of adjusting a resistance of the signal wire according to the preferred embodiment.

FIG. 29 is a circuit diagram illustrating another example of the transition time detecting circuit according to the preferred embodiment.

DESCRIPTION OF REFERENCE SYMBOLS 1 semiconductor integrated circuit
10 signal wire circuit
11 transmitting circuit (transmitter)
12 amplifying circuit (amplifier)
13 receiving circuit (receiver)
21, 22 voltage level detecting circuit (voltage level detector)
23 transition time detecting circuit (transition time detector)
24 transition time adjusting circuit (transition time adjuster)
25 test/mode control circuits
25a test circuit
25b mode control circuit
26 functional circuit
27 substrate voltage control circuit
28 detecting circuit
29 CPU timer
30 activation rate detecting circuit
31 comparing circuit
32 flip-flop
33 comparator
34 counter
35 phase shift clock generating circuit
36 computing element Preferred Embodiment of the Present Invention Below is described a preferred embodiment of the present invention referring to the drawings. FIG. 1 is a circuit diagram illustrating a constitution of a semiconductor integrated circuit 1 according to the preferred embodiment. 10 denotes a signal wire circuit in the semiconductor integrated circuit 1. The signal wire circuit 10 comprises a transmitting circuit 11, an amplifying circuit 12 for amplifying a signal, and a receiving circuit 13. 21 denotes a first voltage level detecting circuit for detecting a voltage level of the signal wire between the transmitting circuit 11 and the amplifying circuit 12. 22 denotes a second voltage level detecting circuit for detecting a voltage level of the signal wire between the amplifying circuit 12 and the receiving circuit 13. The voltage level detecting circuits 21 and 22 comprises MOS transistors, and receive the signal from the signal wire at gates of three NMOS transistors QN1, QN2 and QN3 and a gate of a PMOS transistor QP4 (see a reference symbol D). The voltage level detecting circuits 21 and 22 further comprise PMOS transistors QP1, QP2 and QP3 in which clocks CLK1, CLK2 and CLK3 are inputted to gates, and precharge output wires OUT1, OUT2 and OUT3 before the transition of the signal. In other words, the voltage level detecting circuits 21 and 22 each have the structure of the domino circuit. Other voltage level detecting circuits, in addition to the circuits 21 and 22, may be provided at a plurality of positions in the signal wire so that the tilt of a signal waveform can be accurately detected. However, any other detecting circuits are not shown in the drawing. 23 denotes a transition time detecting circuit for detecting a transition time (corresponding to the tilt of the signal waveform) using detection results of the voltage level detecting circuits 21 and 22. 24 denotes a transition time adjusting circuit for correcting the signal waveform by adjusting the transition time based on a result of the detection by the transition time detecting circuit 23. The transition time adjusting circuit 24 corrects the characteristic of the signal wire circuit 10 to thereby adjust the transition time. There are various possible methods of adjusting the transition time as described later. In this description, a value of a terminal Tc is adjusted so that the transition time is adjusted. 25 denotes a test/mode control circuit. The test/mode control circuit 25 comprises a test circuit 25a and a mode circuit 25b. The test circuit 25a tests the voltage level detecting circuits 21 and 22, transition time detecting circuit 23 and transition time adjusting circuit 24. The mode control circuit 25b controls the respective circuits 21, 22, 23 and 24 to be tested. 26 denotes a functional circuit for realizing the function of the semiconductor integrated circuit 1, and receives the signal transmitted via the signal wire circuit 10 to thereby execute predetermined processing. Though not shown, the functional circuit 26 may also be provided on the transmission side of the signal wire circuit 10. 27 denotes a substrate voltage control circuit. The substrate voltage control circuit 27 supplies a desired substrate voltage to the functional circuit 26. 28 denotes a detecting circuit for detecting a temperature, voltage and frequency of the semiconductor integrated circuit 1. The detecting circuit 28 is connected to the test/mode control circuit 25. 29 denotes a CPU timer. The CPU timer 29 is connected to the test/mode control circuit 25. 30 denotes an activation rate detecting circuit for detecting an activation rate of the signal wire circuit 10. 31 denotes a comparing circuit for judging whether or not a normal expectation value is outputted by the signal wire circuit 10. The comparing circuit 31 is connected to the test/mode control circuit 25.

Referring to FIG. 1, the operation of the semiconductor integrated circuit 1 is described. Before the start-up of the signal wire circuit 10, substrate voltages are applied from the substrate voltage control circuit 27 to substrates BN3, BN2, BN1 and BP2 of the respective MOS transistors of the voltage level detecting circuits 21 and 22. The substrate voltage control circuit 27 may further control a substrate voltage of the receiving circuit 13. Further, the voltages 0V, VDD/2−Vt and VDD−Vt are respectively applied to sources of the respective NMOS transistors QN1, QN2 and QN3, and the voltage of VDD/2+Vt is applied to a source of the PMOS transistor QP4. In relation to VDD, it is defined that a signal voltage amplitude width of the signal wire circuit 10 is 0V to VDD. Vt is a threshold value of the MOS transistors, and the substrate voltage is applied thereto from the substrate voltage control circuit 27 so that Vt is 300 mV. Before the activation of the signal wire in the signal wire circuit 10, the clocks CLK1, CLK2 and CLK3 of the voltage level detecting circuits 21 and 22 once change from the "H" level to the "L" level, and then turn to the "H" level again. The output wires OUT1, OUT2 and OUT3 show the voltage values supplied to the sources of the PMOS transistors QP1, QP2 and QP3. The output wire OUT4 shows the voltage value supplied to the source of the NMOS transistor QN4. After the elapse of a certain amount of time, the signal wire of the signal wire circuit 10 changes from 0V to VDD. At the time, the transition from the "H" level to the "L" level occurs sequentially from the output wire OUT1 to the output wire OUT3. When the signal wire of the signal wire circuit 10 once changes to VDD/2 or below and then changes to VDD during the transition to VDD, the output wire OUT4 changes from the "L" level to the "H" level, which is the detection of the reverse transition. A length of time during which the output wires OUT1-OUT4 changes from the "H" level to the "L" level is measured by the transition time detecting circuit 23a, and the obtained time information is supplied to the transition time adjusting circuit 24. The transition time adjusting circuit 24 compares the supplied time information to signal transition time information which is previously defined, and adjusts the values of the respective components of the signal wire circuit 10 in the case where the actual transition time information of the signal wire is different to the transition time information which is previously defined.

As described, according to the present embodiment, the tilt of the signal waveform of the signal wire can be accurately detected, and such an abnormal state as the reverse transition of the waveform, which is unintentionally caused, can also be detected.

Below is described a constitution in which the description so far is more embodied. FIG. 2 shows details of the voltage level detecting circuit 21. The PMOS transistors QP1, QP2 and QP3 are power-supplied by a voltage supply circuit 21A. The voltage supply circuit 21A comprises a plurality of amplifiers 1 to which voltages of nodes of resistances connected to between the power supply and ground are inputted as reference voltage values. The amplifiers 1 have such a feedback configuration that the output voltage values of the amplifiers 1 are corrected and changed into the reference voltage values. The respective power supply voltage values are supplied to the power supply of the PMOS transistors QP1, QP2 and QP3 from the amplifiers 1 of the voltage supply circuit 21A. In the present preferred embodiment, the source potentials, substrate potentials and clocks of the respective MOS transistors QP1, QP2, QP3, QN1, QN2 and QN3 can be separately controlled.

Figure 3:
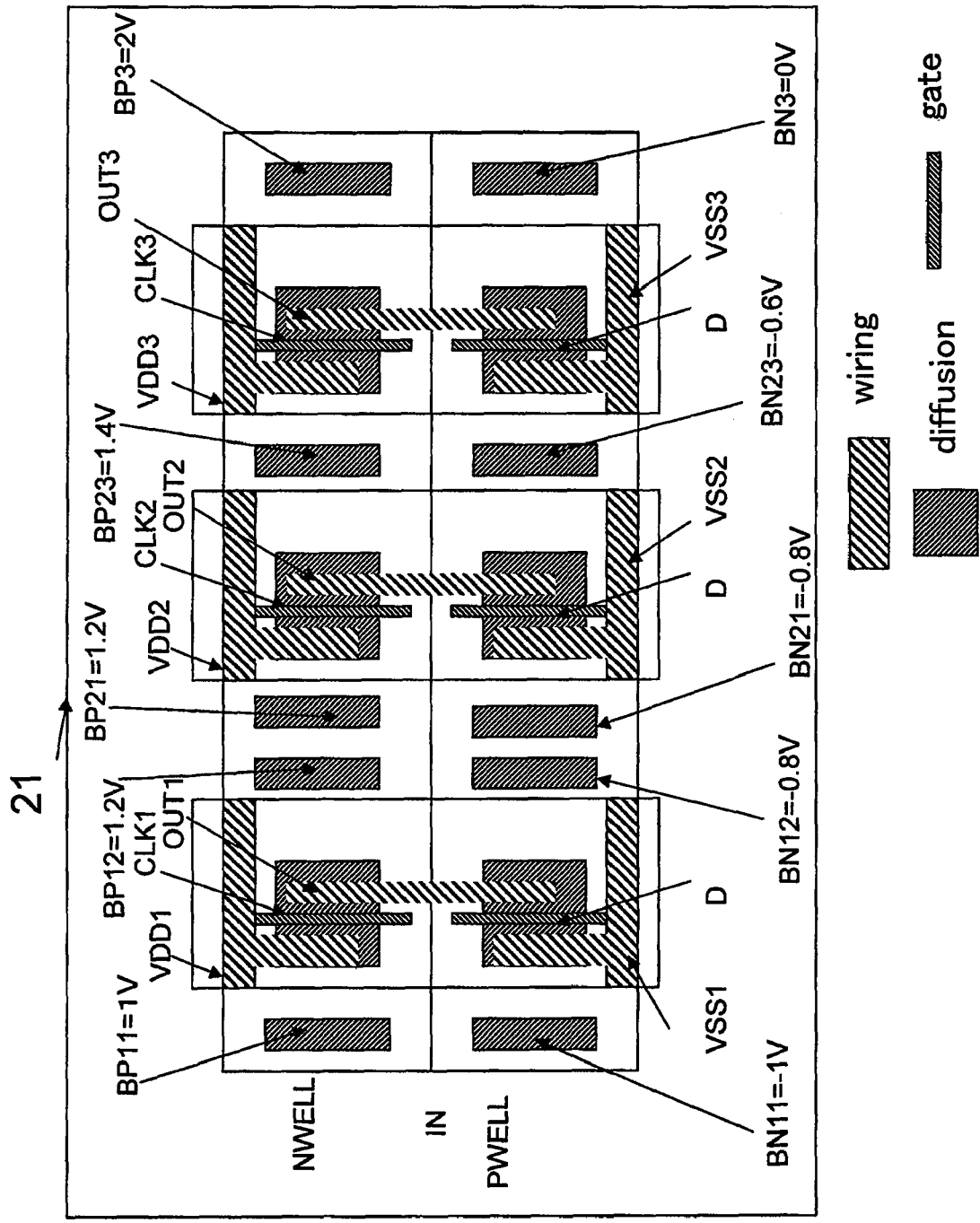
FIG. 3 shows an example of the layout of power/substrate supply in the voltage level detecting circuit according to the preferred embodiment.

FIG. 3 shows details of a method of supplying substrate voltage values BP1, BN1, BP2, BN2, BP3 and BN3, wherein a physical layout drawing of three PMOS transistors QP1, QP2 and QP3 and three NMOS transistors QN1, QN2 and QN3 of the voltage level detecting circuit 21, except for the amplifiers and resistances, are illustrated. The PMOS transistors QP1, QP2 and QP3 are provided on the NWELL, while the NMOS transistors QN1, QN2 and QN3 are provided on the PWELL. The sources of these six MOS transistors QP1, QP2, QP3, QN1, QN2 and QN3 are connected to separate wiring, and potentials VDD1, VDD2, VDD3, VSS1, VSS2 and VSS3 are supplied thereto in the mentioned order. The drain of the PMOS transistor QP1 and the drain of the NMOS transistor QN1 are connected. In a similar manner, the drain of the PMOS transistor QP2 and the drain of the NMOS transistor QN2 are connected. In a similar manner, the drain of the PMOS transistor QP3 and the drain of the NMOS transistor QN3 are connected. The drains of the respective MOS transistors QP1, QP2, QP3, QN1, QN2 and QN3 are outputted to outside via the wirings of the OUT1, OUT2 and OUT3. On the NWELL are provided substrate taps BP11, BP12, BP21, BP23 and BP31. On the PWELL are provided substrate taps BN11, BN12, BN21, BN23 and BN31. As the substrate voltage values of the respective substrate taps in the present preferred embodiment the following are supplied: BP11=1V; BP12=1.2V; BP21=1.2V; BP23=1.4V; BP31=2V; BN11=-V; BN12=-0.8V; BN21=-0.8V; BN23=-0.6V; and BN31=0. In relation to the setting of the substrate voltage values of the respective MOS transistors, for example, an intermediate voltage value obtained when the voltage values of the substrate taps BP11 and BP12 are resistance-divided is the substrate voltage value of the PMOS transistor QP1. Even if a threshold characteristic of the PMOS transistor QP1 is different to those of the PMOS transistors QP2 and QP3 due to the shape thereof or variability of an injection concentration in a channel region, the threshold value of the PMOS transistor QP1 can be changed to obtain a value similar to those of the PMOS transistors QP2 and QP3 when the voltage of the substrate tap BP11 is adjusted. Thus, in relation to the random variability of the transistor characteristic, the characteristic can be corrected. Further, the physical layout shown in FIG. 3 is characterized in that the substrate voltage can be adjusted without the separation of the NWELL on which the PMOS transistors QP1, QP2 and QP3 are formed and the PWELL. More specifically, when the different substrate potentials are supplied to the MOS transistors, it was conventionally adopted to separate the WELLs in order to supply the potentials. In that case, such a layout design that separates the NWELL on which the PMOS transistors QP1, QP2 and QP3 are formed and the PWELL becomes necessary, as a result of which an interval was generated by the separation of the WELLs, resulting in the generation of the area overhead. In the physical layout design shown in FIG. 3 according to the present preferred embodiment, wherein such an interval resulting from the separation of the WELLs is not generated, and the layout area can be thereby reduced. In FIG. 3, the number of the substrate taps between the PMOS transistors QP1 and QP2 is two on each of the WELLs; however, it may be one in the case where the accuracy in the correction of the transistor characteristic is lessened. The layout thus described is effective not only in the voltage level detecting circuit 21 but also in the case where it is desirable to supply different substrate potentials to the MOS transistors.

Figure 4:
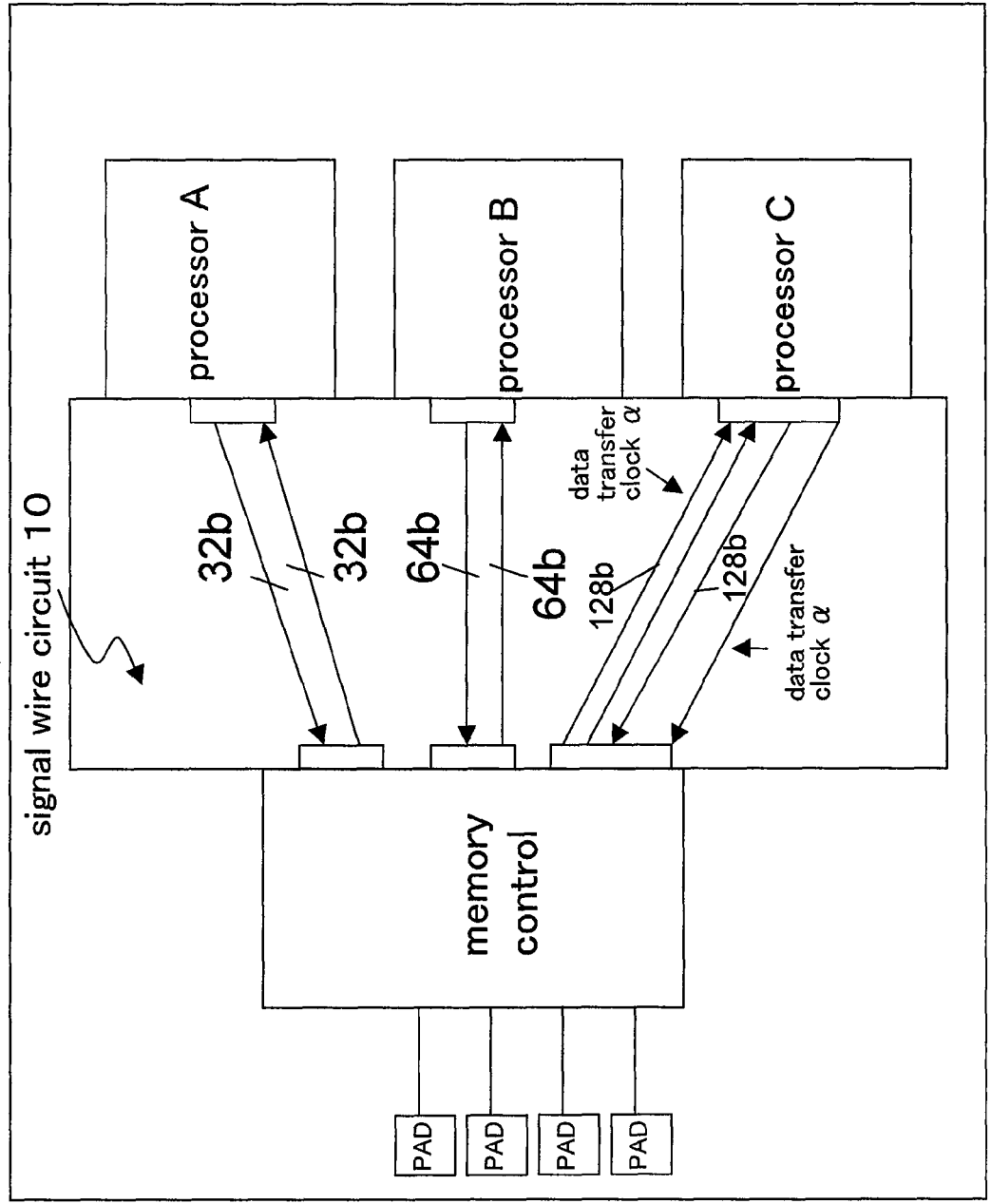
FIG. 4 shows an example of the semiconductor integrated circuit according to the preferred embodiment.

FIG. 4 shows details of the semiconductor integrated circuit 1, illustrating an example where the present invention is applied to a data bus for transmitting and receiving a signal between processors and a memory controller in the case where they are provided as the functional circuit 26. The memory controller communicates data with outside via the PAD. There are possible interface specifications of different types such as the DDR and the conventional CMOS transmission in the data communication between the outside and PAD. The memory controller performs the data communication with a processor A, a processor B and a processor C via the signal wire circuit 10. The signal wire circuit 10 between the respective processors and the memory controller is configured to have such bus widths (32 bits, 64 bits, 128 bits and the like) as shown in the drawing. Between the processor C and the memory controller, a data transfer clock α is provided along with the data wire so that the data is transferred in a clock-synchronizing manner. When the data transfer clock wire and the data wire are provided along with each other, a wiring delay and the like are substantially the same. Therefore, the wiring data communication can be more easily realized than in the case where the clock signal wire and the data wire are not provided in such a manner.

Figure 5:
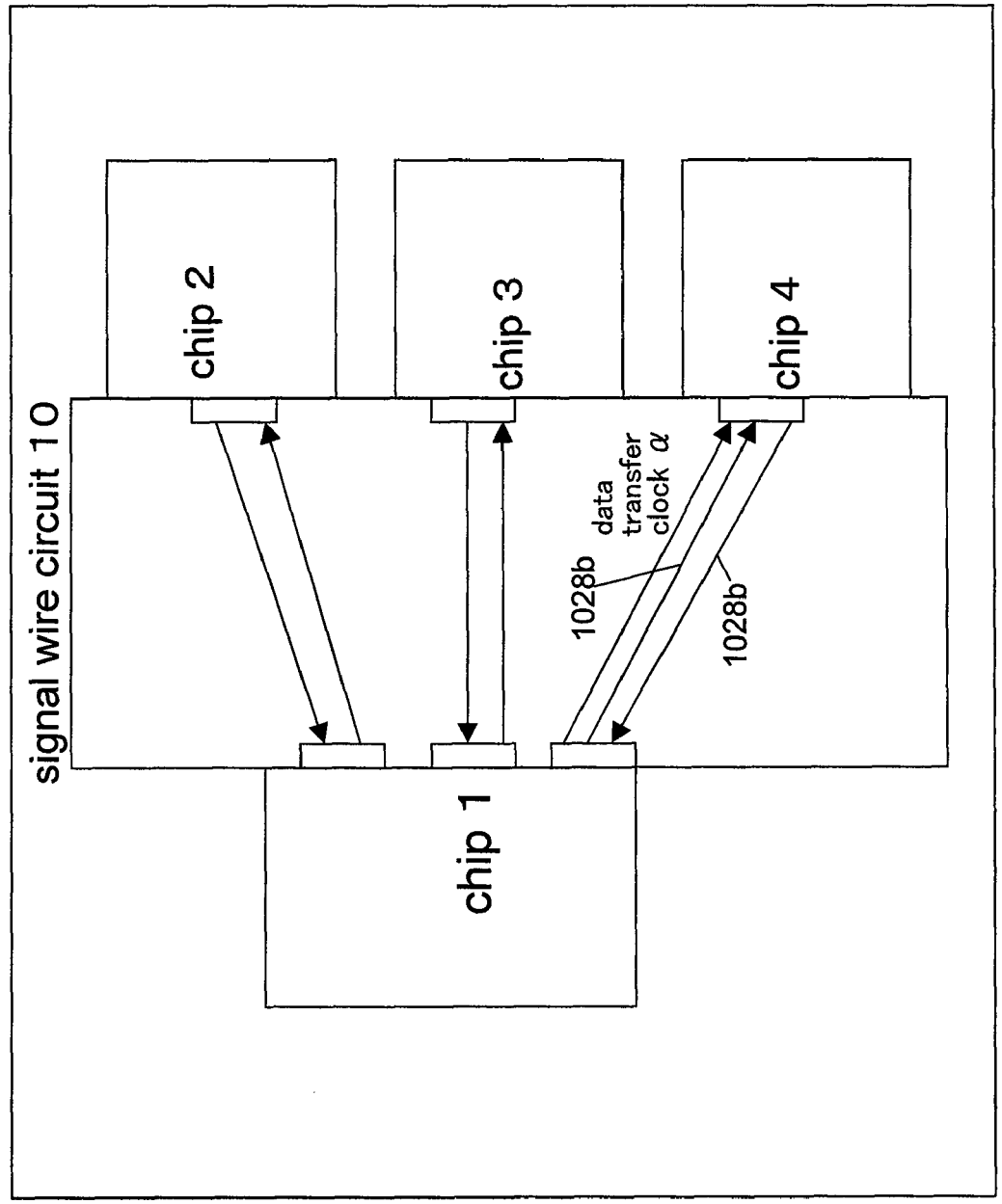
FIG. 5 shows an example of an electronic device according to the preferred embodiment.

FIG. 5 shows an example of details of an electronic device 1D in which the signal wire circuit 10 according to the present invention is mounted across a plurality of chips. A chip 1 performs the data communication with chips 2, 3 and 4 via the signal wire circuit 10. The voltage level detecting circuits 21 and 22 in the signal wire circuit 10 are formed in the respective chips. A material used in the periphery of the signal wire may be a semiconductor such as silicon. The signal wire may not be surrounded by any material.

Figure 6:
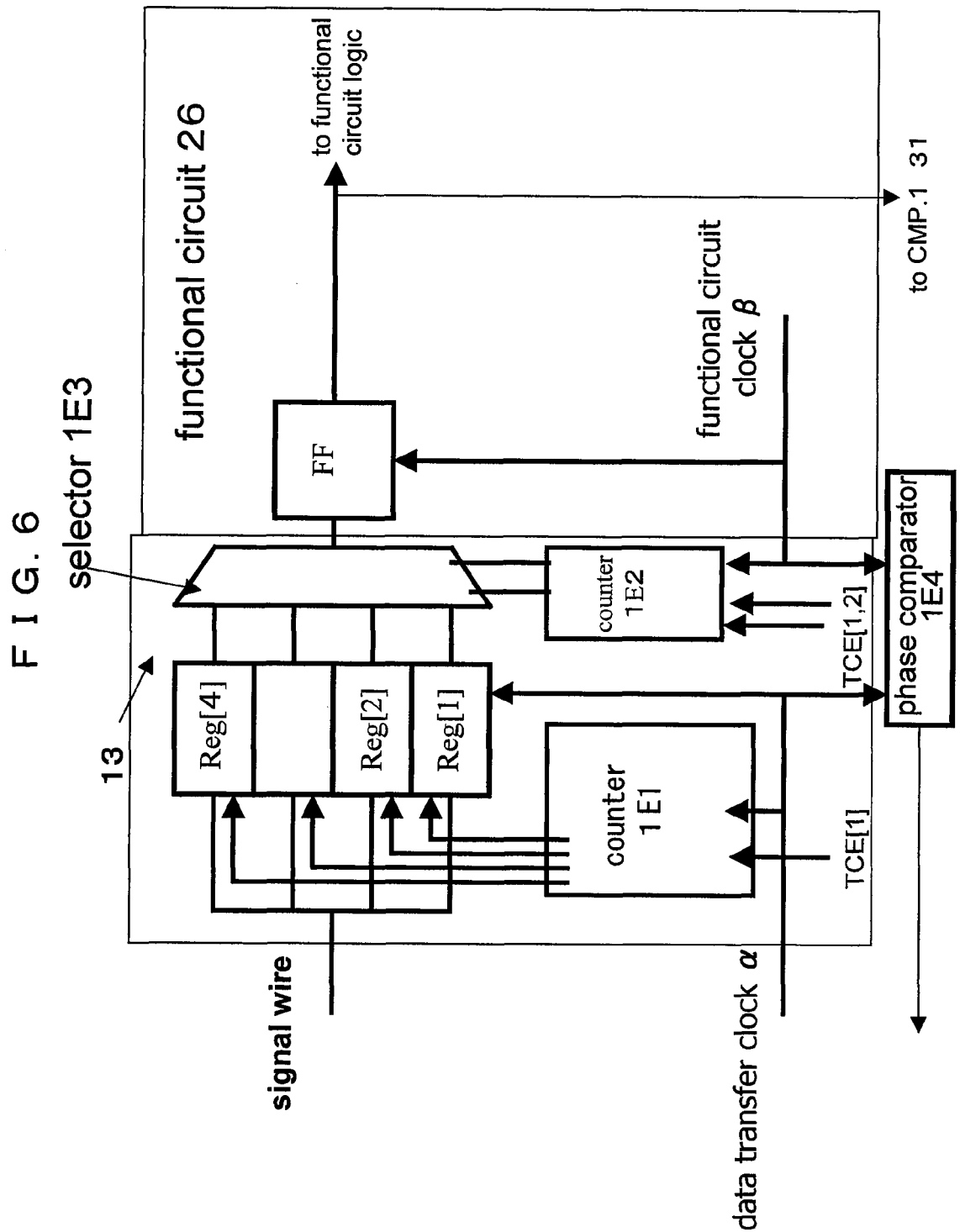
FIG. 6 shows examples of a signal wire circuit and a functional circuit according to the preferred embodiment.

FIG. 6 shows details of an example of the connection between the signal wire circuit 10 and the functional circuit 26. The functional circuit 26 receives data by a flip-flop FF. The rest of the constitution is not particularly limited, and a processor, a memory controller or the like, for example, may be provided. The receiving circuit 13 comprises a counter 1E1, a counter 1E2, registers REG[1:4], and a selector circuit 1E3. The data from the data wire is inputted to the registers REG[1:4], and the registers REG[1:4] are controlled by output signals from the counter 1E1. More specifically, four output signals are outputted from the counter 1E1, one of the four output signals is enabled, and only the data of the register REG which is enabled is fetched. Of the outputs of the respective registers REG[1:4], one of the four pieces of data is selected by the selector circuit 1E3 which uses the output signal from the counter 1E2 as a control signal, and the data is fetched into the flip-flop FF in the functional block 26. The data transfer clock α increments the counter 1E1.

Figure 7:
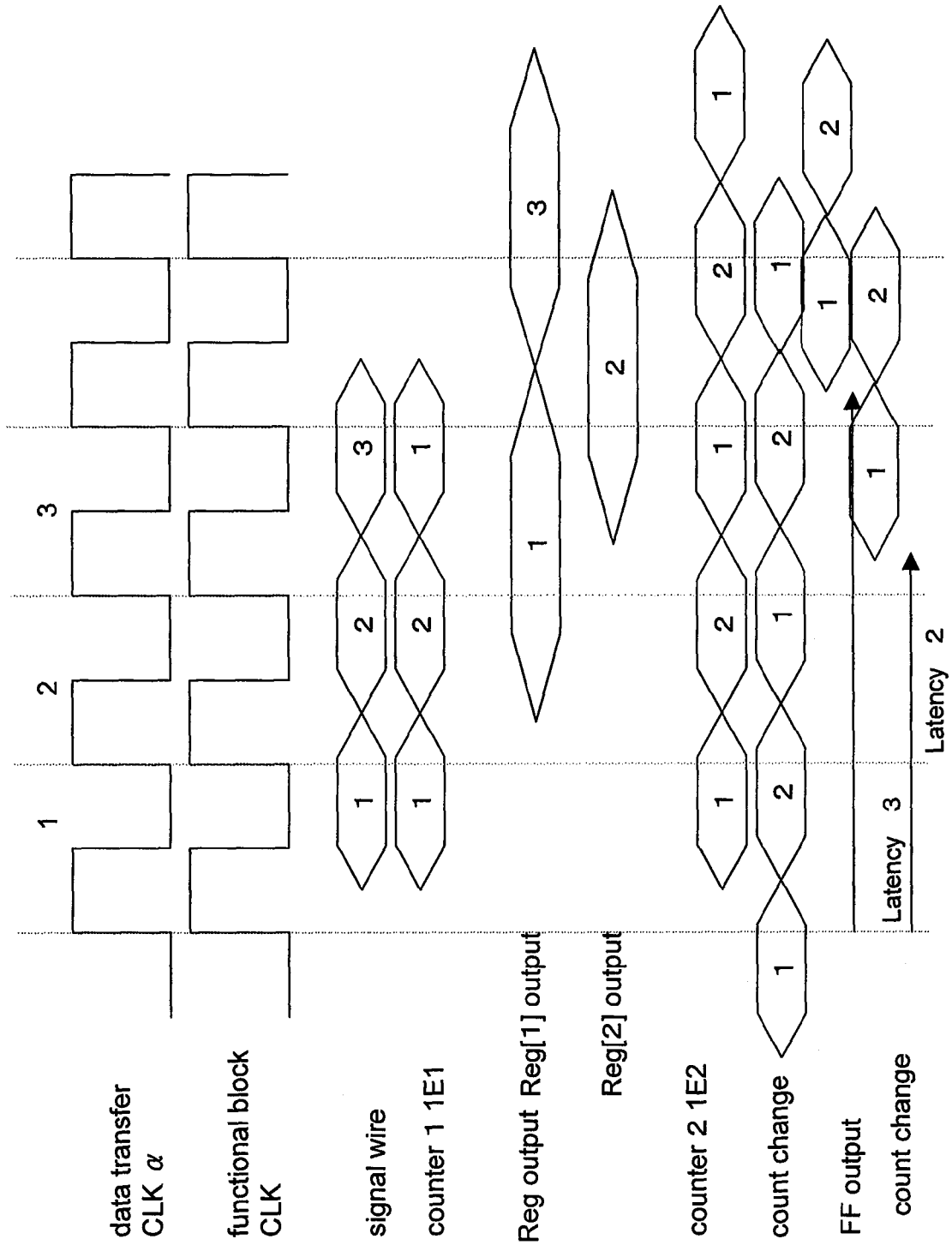
FIG. 7 is a timing chart of the signal wire circuit and the functional circuit according to the preferred embodiment.

It is hypothetically set in the designing process that only two of the registers REG[1:4] are used, the counter 1E1 performs the count from 1 to 2 by the data transfer clock α in the state where only the two registers are used, and the data is inputted to each of the registers REG[1:2]. Further, it is hypothetically set that the counter 1E2 which makes a count by the clock β of the functional circuit 26 can select the data from 1 to 2. In such a case, when a difference between a data arrival time and a delay of a rising edge arrival time of the clock β of the function circuit 26 is increased after the manufacturing process, there is generated a difference in the output expectation value of the receiving circuit 13. A timing chart in that case is shown in FIG. 7. The data transfer clock can be used as the clock of the functional circuit 26. In the drawing, a horizontal axis denotes time, and a vertical axis denotes each of the data transfer clock α, functional block clock, cycle number which shows the data of the signal wire is transferred by the data transfer clock α of which cycle, count value (decimal number) of the counter 1E1, cycle number which shows the output of each register is transferred by the data transfer clock α of which cycle, count value of the counter 2E2, and cycle number which shows the output value of the flip-flop of the functional circuit 26 is transferred by the data transfer clock α of which cycle. In the example, the latency (multiple of clock frequency) is 3. A result outputted by the CMP.131 is transmitted to the mode control circuit 25, and a speed of the transmitting circuit in the signal wire circuit 10 is increased by the mode control circuit 25, the delay time adjusting circuit 24 and so on. In the case where the output expectation value is different in the cycles thereafter, the count value of the counter 2E2 is shifted by one at TC[2]. Accordingly, the latency (multiple of clock frequency) is only 2, and the signal wire data can be surely transmitted to the functional circuit 26. FIG. 7 is a timing chart of nodes at a section where "the count number is changed" is written.

Figure 8:
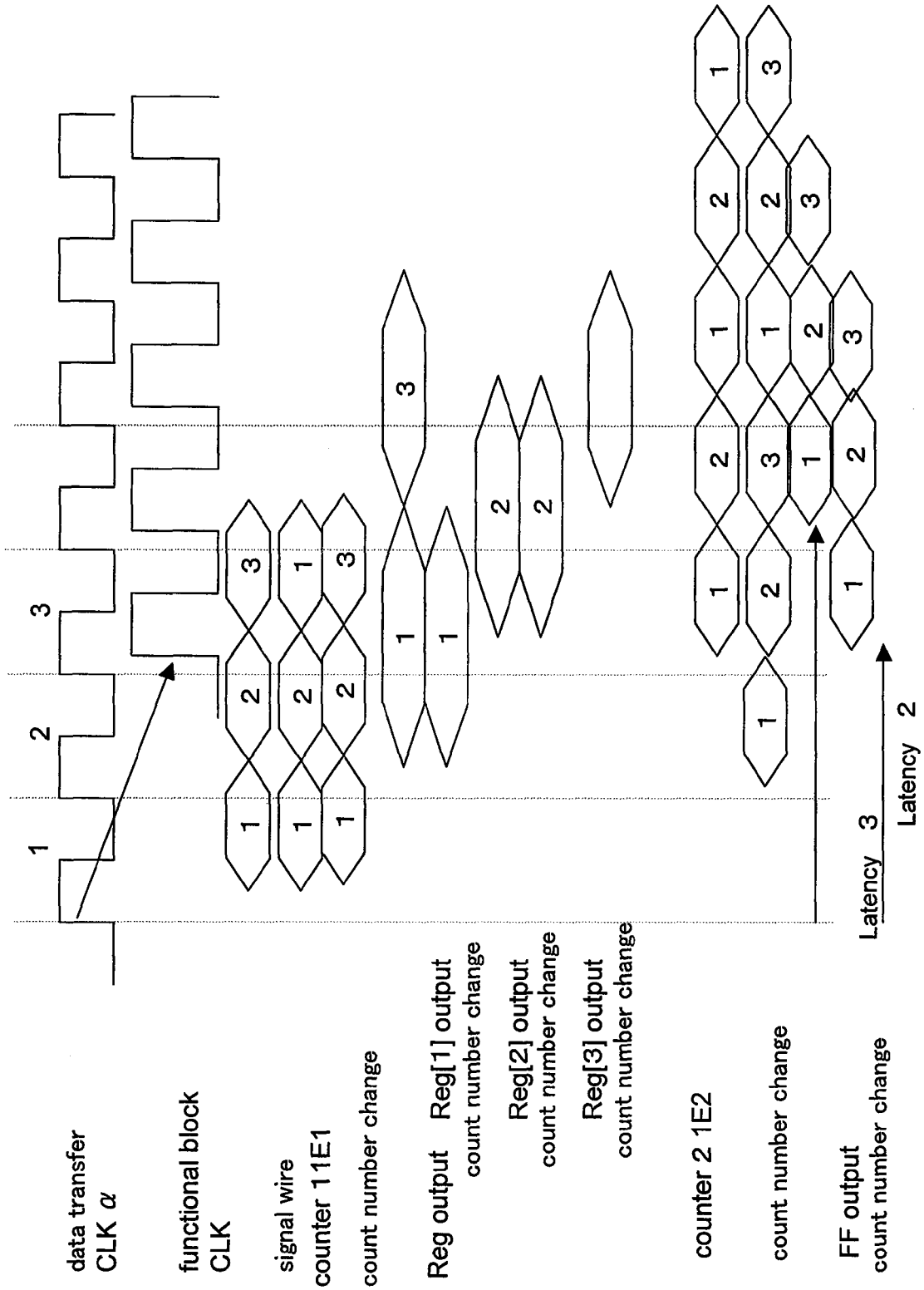
FIG. 8 is a timing chart of the signal wire circuit and the functional circuit according to the preferred embodiment.

FIG. 8 is a timing chart in the case where [(delay difference between the rising edge of the data transfer clock α and the rising edge of the clock β of the functional circuit 26)+data transfer time] is smaller than [(latency in the data transfer: a multiple of clock frequency)−(number of registers M-1)× clock frequency]. A horizontal axis denotes time, and a vertical axis denotes each of the data transfer clock α, functional block clock, cycle number which shows the data of the signal wire is transferred by the data transfer clock α of which cycle, count value (decimal number) of the counter 1E1, cycle number which shows the output of each register is transferred by the data transfer clock α of which cycle, count value of the counter 2E2, and cycle number which shows the output value of the flip-flop of the functional circuit 26 is transferred by the data transfer clock α of which cycle.

The number of the registers REG[1:4] to be used is increased by one at TC[1]. The delay difference between the rising edge of the data transfer clock α and the rising edge of the clock β of the functional circuit 26 is detected by a phase comparator 1E5, and the data transfer time is obtained from a time difference by which the data changes to VDD/2 in the voltage level detecting circuits 21 and 22.

At the same time as the increase of the number of the registers REG[1:4] to be used by one at TC[1], the count value of the counter 1E2 is also increased at TC[1]. Then, the count value is gradually decreased by 1 at TC[2], and the selector circuit 1E3 is controlled so that the fetched data of REG[1:3] can be selected. According to the configuration, the number of the registers REG[1:M] to be used can be variably adjusted even in the case where the delay of the data transfer clock α and the delay of the data arrival time and the clock β of the functional circuit 26 are largely different to those in the designing process, and the latency (multiple of clock frequency) is merely 2. As a result, the data communication can be performed in a stable manner. The data transfer clock α may be transferred from the memory controller shown in FIG. 4, or may be transferred from the clock generating circuit in the semiconductor integrated circuit 1.

Figure 9:
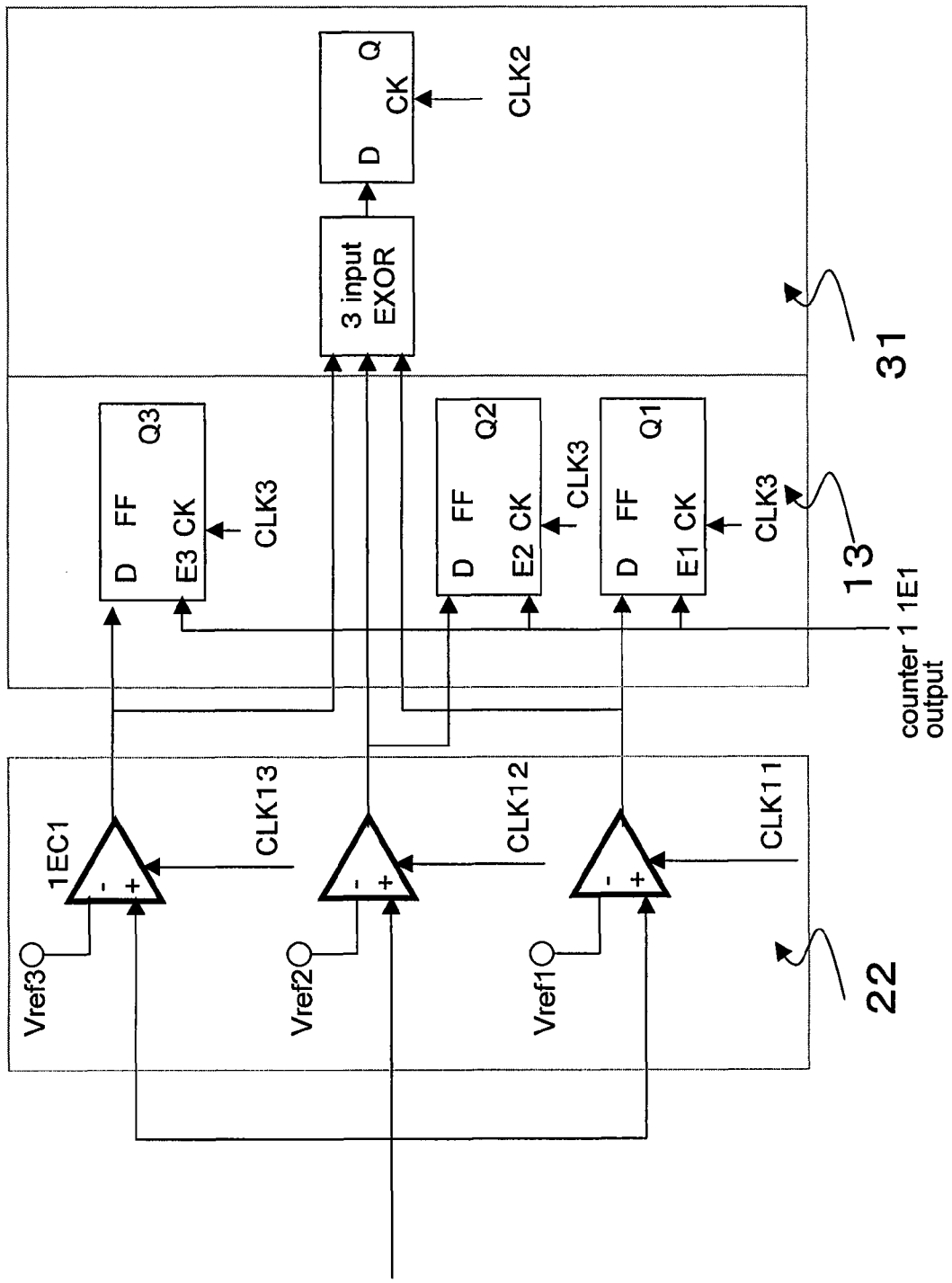
FIG. 9 shows examples of the signal wire circuit, voltage level detecting circuit, functional circuit and comparing circuit according to the preferred embodiment.
Figure 10A:
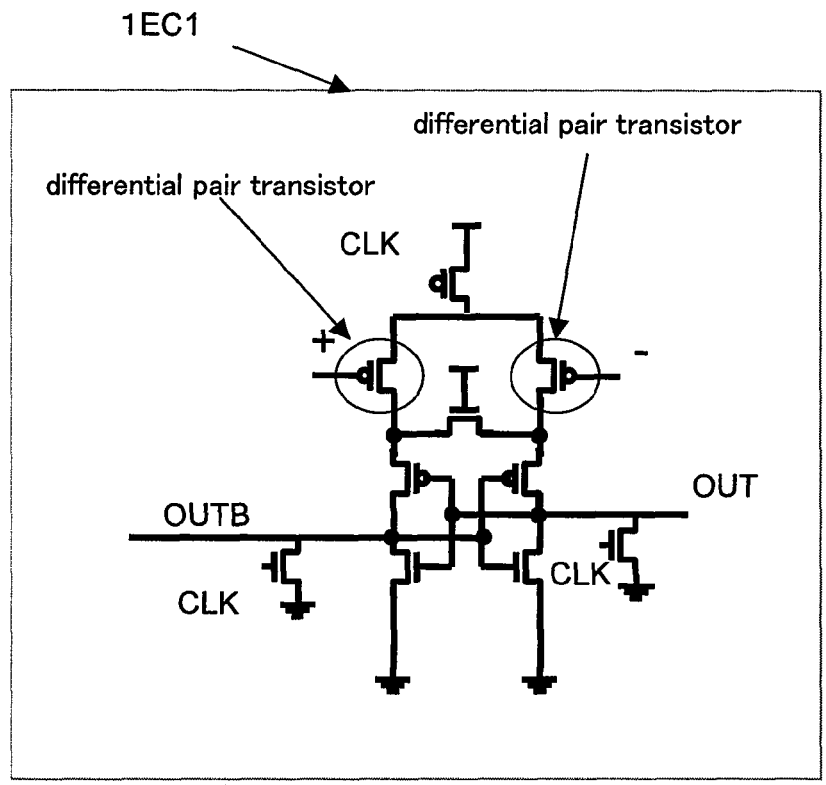
FIG. 10A shows a first example of a differential amplifying circuit according to the preferred embodiment.
Figure 10B:
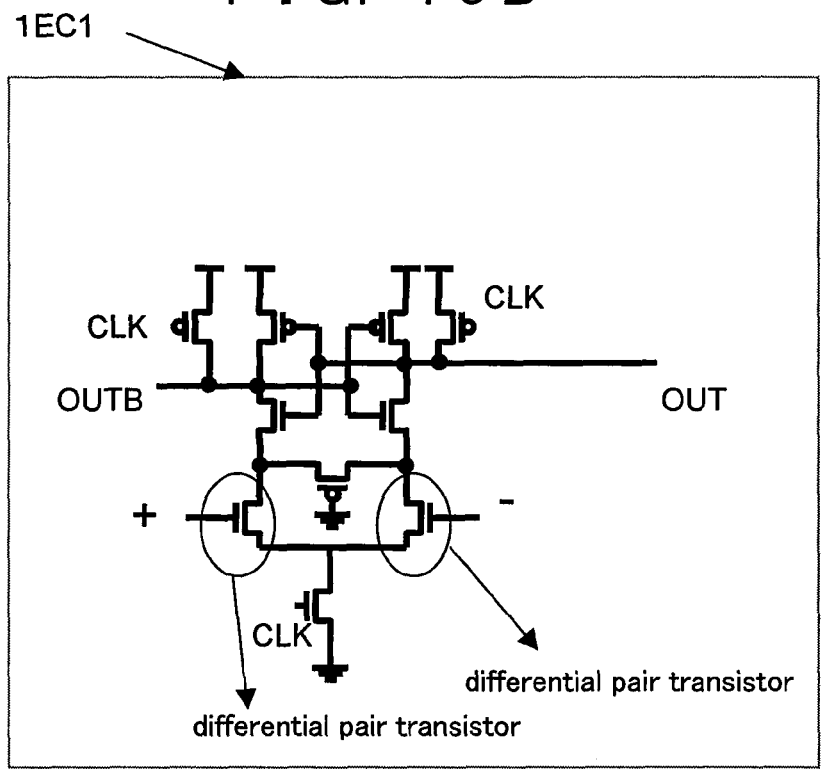
FIG. 10B shows a second example of the differential amplifying circuit according to the preferred embodiment.

FIG. 9 is another circuit diagram of the example shown in FIG. 6. The drawing shows an example in which the voltage level detecting circuit 22, receiving circuit 13 and expectation value comparing circuit 31 are realized in a simplified manner. In FIG. 9, the voltage level detecting circuit 22 comprises three differential circuits 1EC1. The respective differential circuits 1EC1 are configured in such a manner as shown in FIGS. 10A and 10B. The respective differential circuits 1EC1 amplify respective differences between an input signal voltage value and reference voltages Vref1, Vref2 and Vref3 in synchronization with clocks 11, 12 and 13. The difference between FIGS. 10A and 10B is whether PMOS transistors or NMOS transistors constitute differential pair transistors. The receiving circuit 13 shown in FIG. 9 comprises three registers, and the outputs of the respective differential circuits 1EC1 are connected to data input terminals of the registers. The comparing circuit 31 comprises a flip-flop synchronizing with a three-input EXOR for judging whether or not the outputs of the three differential circuits 1EC1 are consistent with one another by clk2.

Delay values which are previously set constitute clocks clk11, clk12 and clk13. For example, delay values of 10 psec are set in the clocks clk11, clk12 and clk13. Different voltage values are set in the reference voltages Vref1, Vref2 and Vref3, which have such a potential difference as Vref1=0.4V, Vref2=0.5V and Vref3=0.6V. In the case where the tilt of the waveform of the signal wire satisfies a reference waveform tilt value [V/sec], all of the differential circuits shown in FIG. 10A outputs "H", and "H" is fetched into the data of the flip-flop in the comparing circuit 31. A circuit for detecting the tilt of the waveform in the fall of the signal wire can be realized by a circuit in which delay values are set in the order of the clocks clk11, clk12 and clk13. Further, the comparing circuit 31 can be configured in the same manner. Thus configured, a data retaining circuit can be shared by the voltage level detecting circuit 22 and the receiving circuit 13. As a result, an area reduction can be realized, and power consumption can be reduced.

When the differential pair transistors shown in FIGS. 10A and 10B are configured according to the layout shown in FIGS. 11A and 11B, an offset (threshold difference) of the differential pair transistors can be lessened because a potential difference is generated in the resistances on the NWELL and the substrate voltages of the differential pair transistors are thereby changed when the substrate voltage values are differentiated as set in the substrate taps VBP11 and VBP12 shown in FIG. 11A, as a result of which the threshold values can be equal. In the absence of any variability in the threshold values of the differential pair transistors, for example, the same potential is set in the substrate taps VBP11 and VBP12, which prevents the generation of the offset. In the presence of any variability in the threshold values of the differential pair transistors, different potentials are set in VBP11 and VBP12. Accordingly, the substrate potentials of the respective transistors can be finely adjusted depending on a positional relationship between the differential pair transistors and the substrate taps. In brief, the threshold values can be adjusted. As a result of the improvement of the offset of the differential pair transistors, the voltage values can be compared with a higher accuracy.

Next is described various examples of the transition time adjusting circuit 24. Any of these transition time adjusting circuits 24 adjusts the waveform of the signal wire by changing the characteristic of the signal wire circuit 10 in accordance with the transition time detected by the transition time detecting circuit 23. In order to do so, it is necessary to generate a control signal for changing the characteristic of the signal wire circuit 10 based on the transition time detected by the transition time detecting circuit 23. A constitution necessary for the generation of the control signal, which can be easily realized by the ordinarily skilled in the art by means of a comparing circuit, a counter and a flip-flop, is not shown.

Figure 12:
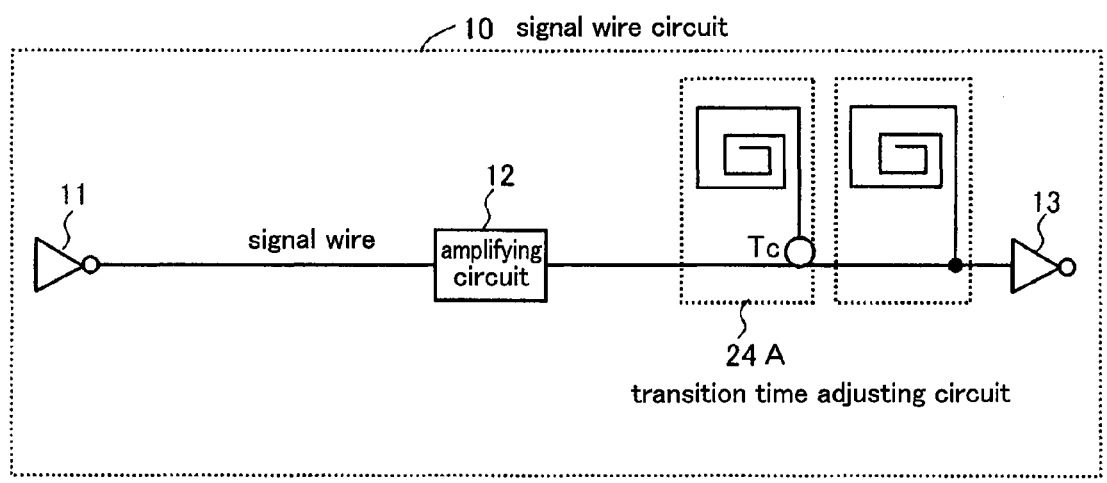
FIG. 12 is a circuit diagram illustrating an example of a transition time adjusting circuit capable of adjusting an inductance of a signal wire according to the preferred embodiment.

FIG. 12 shows a transition time adjusting circuit 24A which is an example of the transition time adjusting circuit 24. The transition time adjusting circuit 24A adjusts an inductance value of the signal wire. The transition time adjusting circuit 24A applies an electric current to a connecting point Tc of the signal wire circuit 10 so as to generate a mutual interference in the inductance components of the signal wire to thereby adjust the inductance. A value of the current is decided in accordance with the transition time detected by the transition time detecting circuit 23.

Figure 13:
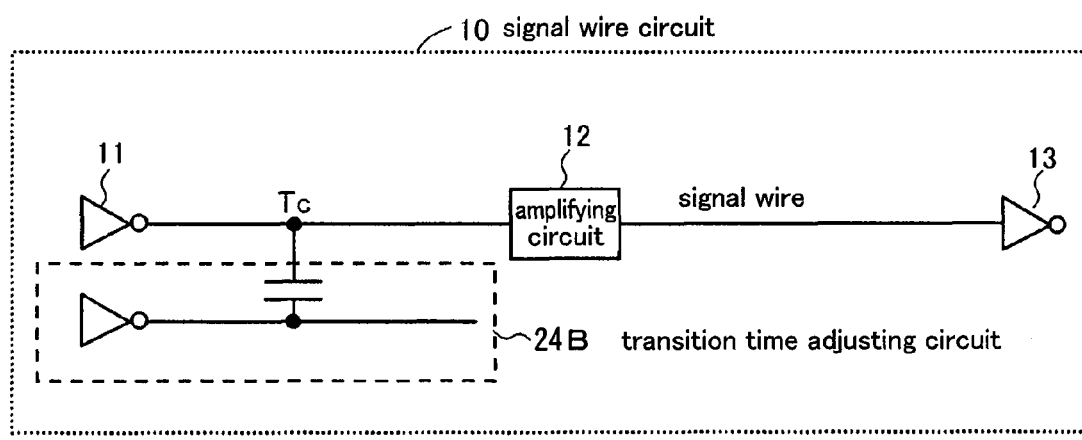
FIG. 13 is a circuit diagram illustrating an example of a transition time adjusting circuit capable of adjusting a capacitance of the signal wire according to the preferred embodiment.

FIG. 13 shows a transition time adjusting circuit 24B which is another example of the transition time adjusting circuit 24. The transition time adjusting circuit 24B adjusts a capacitance of the signal wire. The transition time adjusting circuit 24B generates a waveform transition, which is the transition of the same phases or the transition of the reverse phases, in the wiring provided along with the signal wire in accordance with the transition time detected by the transition time detecting circuit 23. Accordingly, the transition time adjusting circuit 24B can adjust the capacitance of the signal wire by adjusting the direction and amplitude of the transition to be generated in the wiring.

Figure 14:
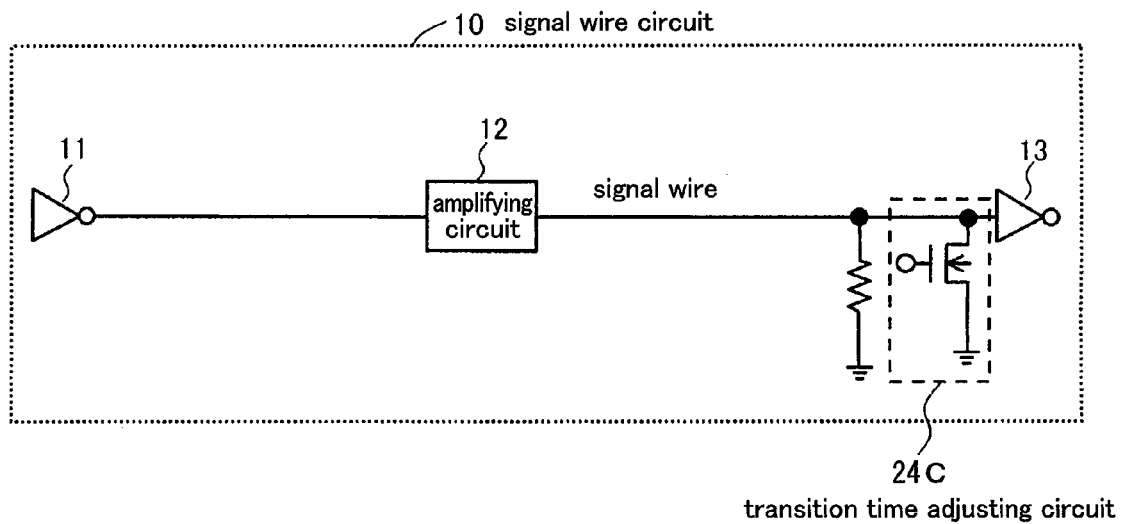
FIG. 14 is a circuit diagram illustrating an example of a transition time adjusting circuit capable of adjusting a terminal resistance of the signal wire according to the preferred embodiment.

FIG. 14 shows a transition time adjusting circuit 24C which is still another example of the transition time adjusting circuit 24. The transition time adjusting circuit 24C adjusts a value of a resistance functioning as a terminal resistance with respect to the receiving circuit 13 in the signal wire. The transition time adjusting circuit 24C can adjust the terminal resistance of the signal wire by adjusting the gate voltages of the NMOS transistors in accordance with the transition time detected by the transition time detecting circuit 23.

Figure 15:
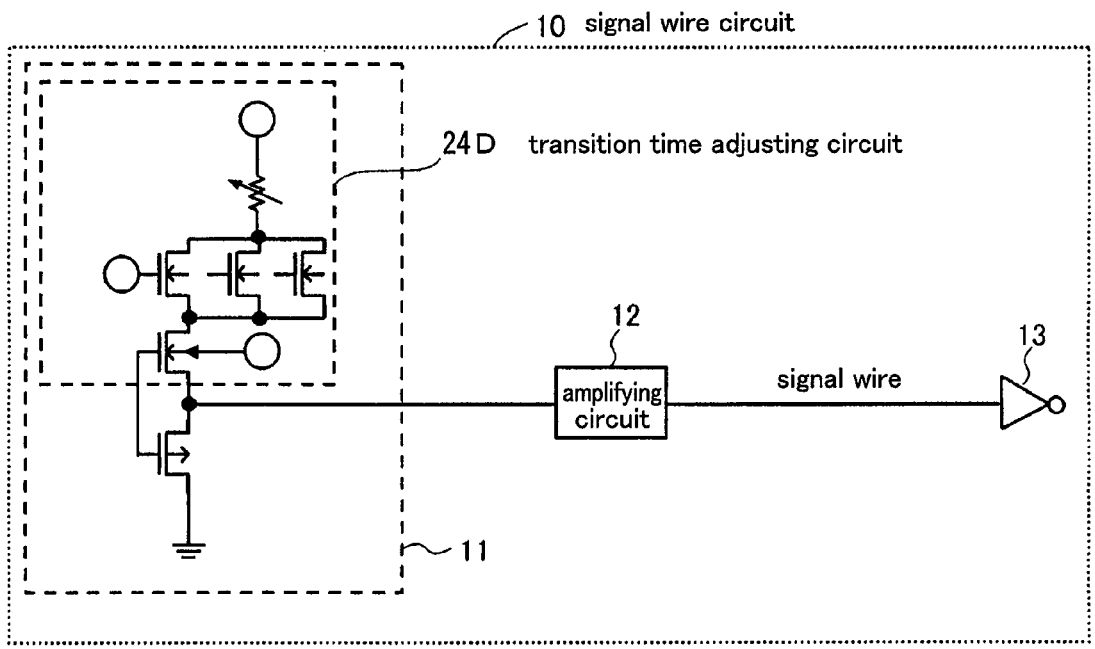
FIG. 15 is a circuit diagram illustrating an example of a transition time adjusting circuit capable of adjusting a drive performance of the signal wire according to the preferred embodiment.

FIG. 15 shows a transition time adjusting circuit 24D which is still another example of the transition time adjusting circuit 24. The transition time adjusting circuit 24D controls a drive performance adjuster of the transmitting circuit 11 in the signal wire. The transmission-side drive performance adjuster controls the degree of parallelization of the NMOS transistors constituting the transmission-side drive, source power-supply voltage values, voltage values of substrates, resistance values also constituting the transmission-side drive and the like. The drive performance of the amplifying circuit 12 shown in FIG. 1 may be controlled by the transition time adjusting circuit 24D. As a result, the accuracy can be further improved.

FIG. 16 shows an example of the transition time adjusting circuit 24 for simultaneously controlling the drive performance and the terminal resistance. 5A denotes a circuit serving as a terminal resistance circuit and a drive performance adjusting circuit, which corresponds to the transition time adjusting circuit 24D. In the circuit 5A, a variable resistance 5B and a variable inverter 5B1 are connected in parallel, and signal wires 5B1I and 5B1O are inputted to a differential circuit. When values inputted to terminals En2[1:2] and Ep2[1:2] are changed in accordance with the detection result of the transition time detecting circuit 23, the drive performance of the variable inverter 5B1 can be changed.

FIG. 17 shows details of the variable resistance 5B of FIG. 16. The variable resistance 5B comprises three transfer gates Trans5B1, Trans5B2 and Trans5B3. PMOS or NMOS transistors constitute the transfer gates Trans5B1, Trans5B2 and Trans5B3. When values inputted to gate voltage adjusting terminals EN1[1:3] and EP1[1:3] for adjusting three resistances constituted with the transfer gates Trans5B1, Trans5B2 and Trans5B3 and substrate voltage terminals BP1[1:3] and BN1[1:3] are adjusted in accordance with the detection result of the transition time detecting circuit 23, a resistance value of the variable resistance 5B can be controlled. The voltages at each of the gate voltage adjusting terminals EN1[1:3] and EP1[1:3] and the substrate voltage terminals BP1[1:3] and BN1[1:3] have analogue values. These terminals are adjusted so that a voltage difference between the signal wires 5B1I and 5B1O is increased in order to allow the data to be transmitted with a desired clock frequency by the signal waveform information obtained in the voltage level detecting circuit 22 and the expectation value of the receiving circuit 13. More specifically, when the data (gigahertz order) is transferred at a high speed, the variable resistance 5B is set to have a few kohms. When the data is transferred at a low speed (at most gigahertz order), the gate voltage adjusting terminals EN1[1:3] and the gate voltage adjusting terminals EP1[1:3] for adjusting the resistance value of the variable resistance 5B are respectively set to 0V and the power supply voltage value.

Accordingly, it becomes unnecessary to connect the signal wire 5B1I to the terminal resistance, and an end thereof can be open when the data is transferred at a low speed, which blocks the DC current generated in the terminal resistance. As a result, the power consumption can be reduced. Further, in the case where the high-speed data transfer and the low-speed data transfer are executed according to different methods (in this example, the current mode method in the high-speed data transfer, while the voltage mode method in the low-speed data transfer), the constitution described above can be adopted in both the methods.

Figure 18:
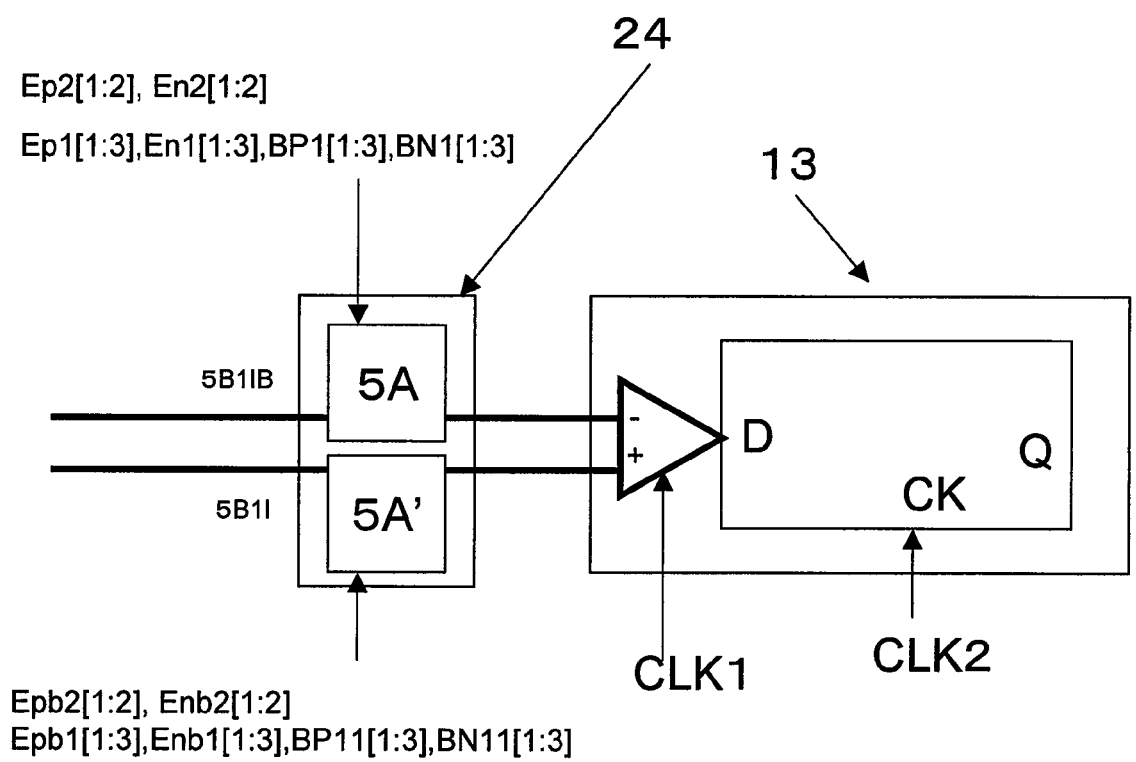
FIG. 18 shows an example of the receiving circuit according to the preferred embodiment.

FIG. 18 shows a case where the terminal resistance circuit 5A is used for a differential signal of the receiving circuit 13, wherein the variable terminal circuit shown in FIG. 16 is connected to the signal wires 5B1I and 5B1IB. In a terminal resistance 5A', another control signal can be connected. Therefore, the resistance values of the terminal resistance circuits 5A and 5A' can be adjusted in accordance with the tilts of the waveforms of the signal wires 5B1I and 5B1IB.

FIG. 19 shows an example in which the variable resistance 5B is connected to the pair of differential signal wires 5B1I and 5B1IB of the receiving circuit 13. In accordance with the detection result of the transition time detecting circuit 23, the values of the gate voltage adjusting terminals EN1[1:3] and EP1[1:3] for adjusting three resistances of the transfer gates and the values of the substrate voltage terminals BP1 [1:3] and BN1[1:3] are adjusted. Accordingly, the resistance values of the terminal resistance 5B can be adjusted in accordance with the tilts of the waveforms of the pair of signal wires 5B1I and 5B1IB.

Figure 20:
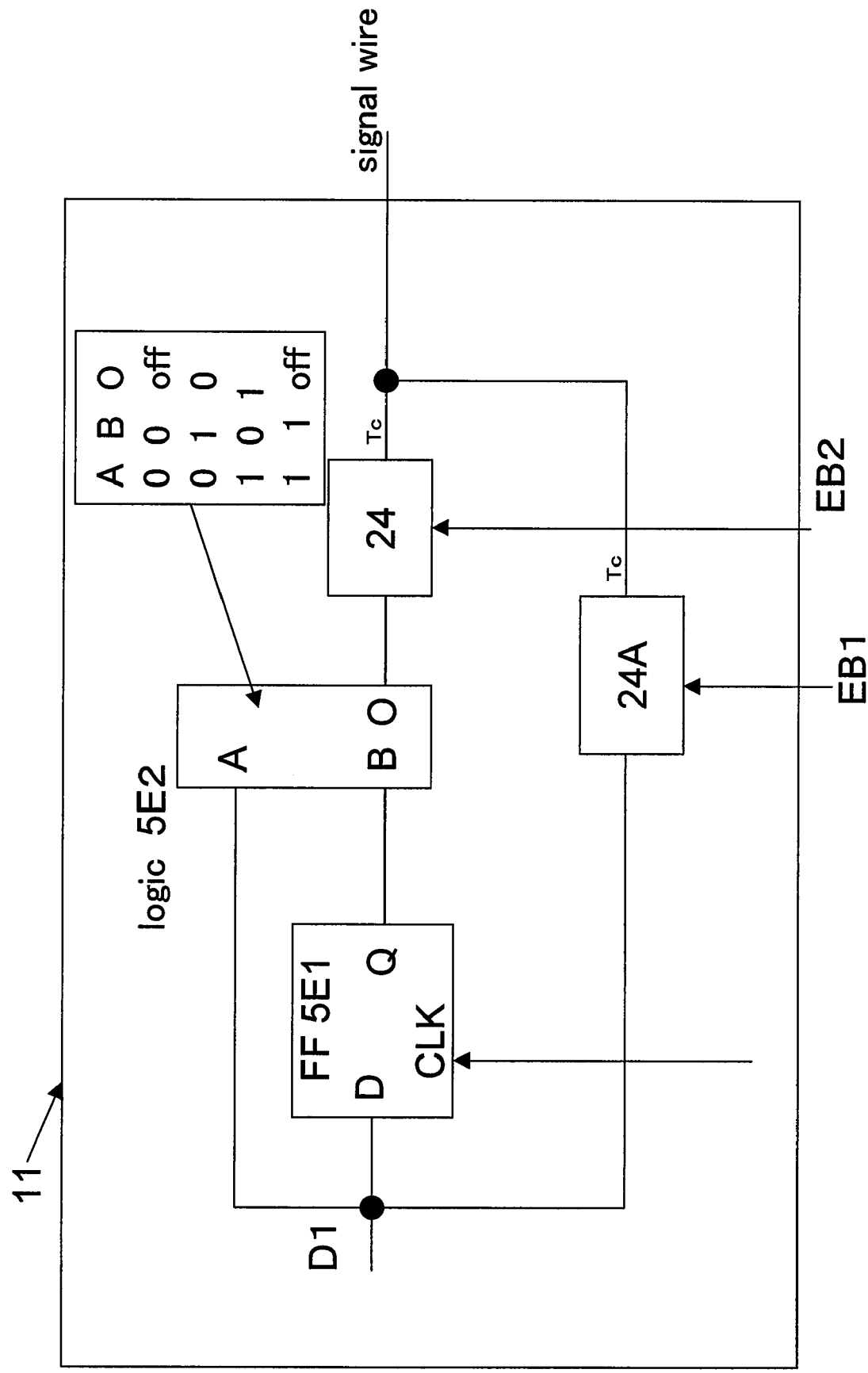
FIG. 20 shows an example of a transmitting circuit according to the preferred embodiment.

FIG. 20 is a drawing showing details of the transmitting circuit 11 of FIG. 1. Data D1 before the transmission is connected to a data input of a flip-flop 5E1, an A terminal of a logic 5E2 and an input terminal of the transition time adjusting circuit 24. Further, a B terminal of the logic 5E2 is connected to an output terminal Q of the flip-flop 5E1, and a truth table of a logic 5E is as shown in FIG. 20. When the A and B input terminals show the same values, the data is not transmitted to and outputted from the transition time adjusting circuit 24. When the A and B input terminals show the different values, the data is transmitted to and outputted from the transition time adjusting circuit 24. The transition time adjusting circuit 24A constantly transmits the data D1. According to the constitution, the voltage amplitude and the current performance of the signal wire can be adjusted according to the data pattern of the signal wire. Further, the transition time adjusting circuits 24 and 24A adjust the output voltage values by control signals EB1 and EB2 from the terminal Tc shown in FIG. 1. As a result, the tilt of the waveform of the signal wire in the transmitting circuit 11 can be changed in accordance with the data pattern. In other words, the frequency of the signal wire can be modulated because the data transfer time is variable, which increases the transmission speed.

Figure 21:
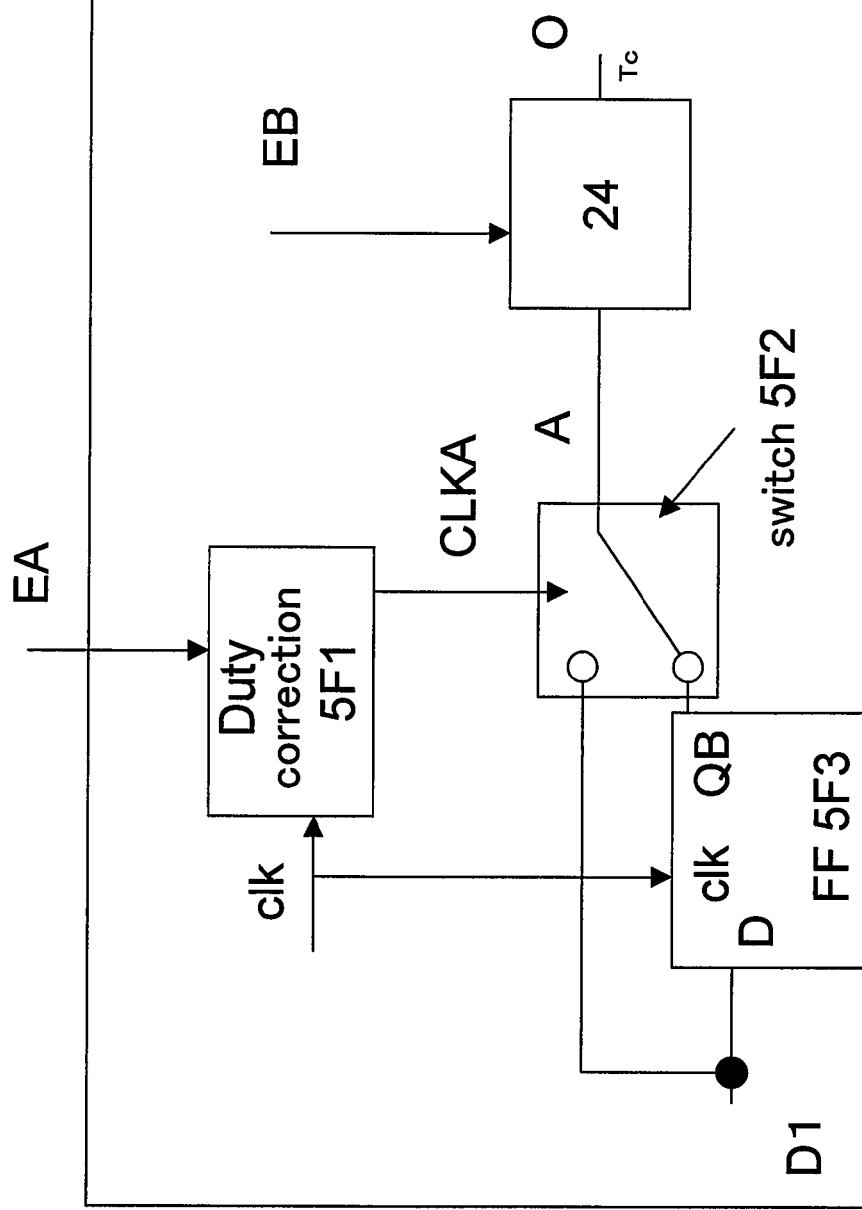
FIG. 21 shows an example of the transmitting circuit according to the preferred embodiment.

FIG. 21 is another drawing showing details of the transmitting circuit 1 of FIG. 1. The data D1 before the transmission is connected to a data input of a flip-flop 5E3 and a terminal of a switch 5F2. A transmission clock clk is inputted to a duty correction 5F1 and a clock terminal of the flip-flop 5E3. The switch 5F2 performs the switching operation by a clock CLKA from the duty correction 5F1, and transmits the inputted D1 for a period during which the clock CLKA is "H" and an inversion output QB of the flip-flop 5E3 is transmitted for a period during which the clock CLKA is "L". The other terminal of the switch 5F2 is inputted to the transition time adjusting circuit 24. The duty correction 5F1 adjusts a Duty ratio (ratio between "H" period and "L" period) of the clock CLKA by a control signal EA from the terminal Tc shown in FIG. 1. Further, the transition time adjusting circuit 24 adjusts the output voltage value by a control signal EB outputted from the transition time detecting circuit 23. Thus, the tilt of the signal wire of the transmitting circuit 11 can be changed. In other words, the frequency of the signal wire can be modulated because the data transfer time is variable, which increases the transmission speed.

Figure 22:
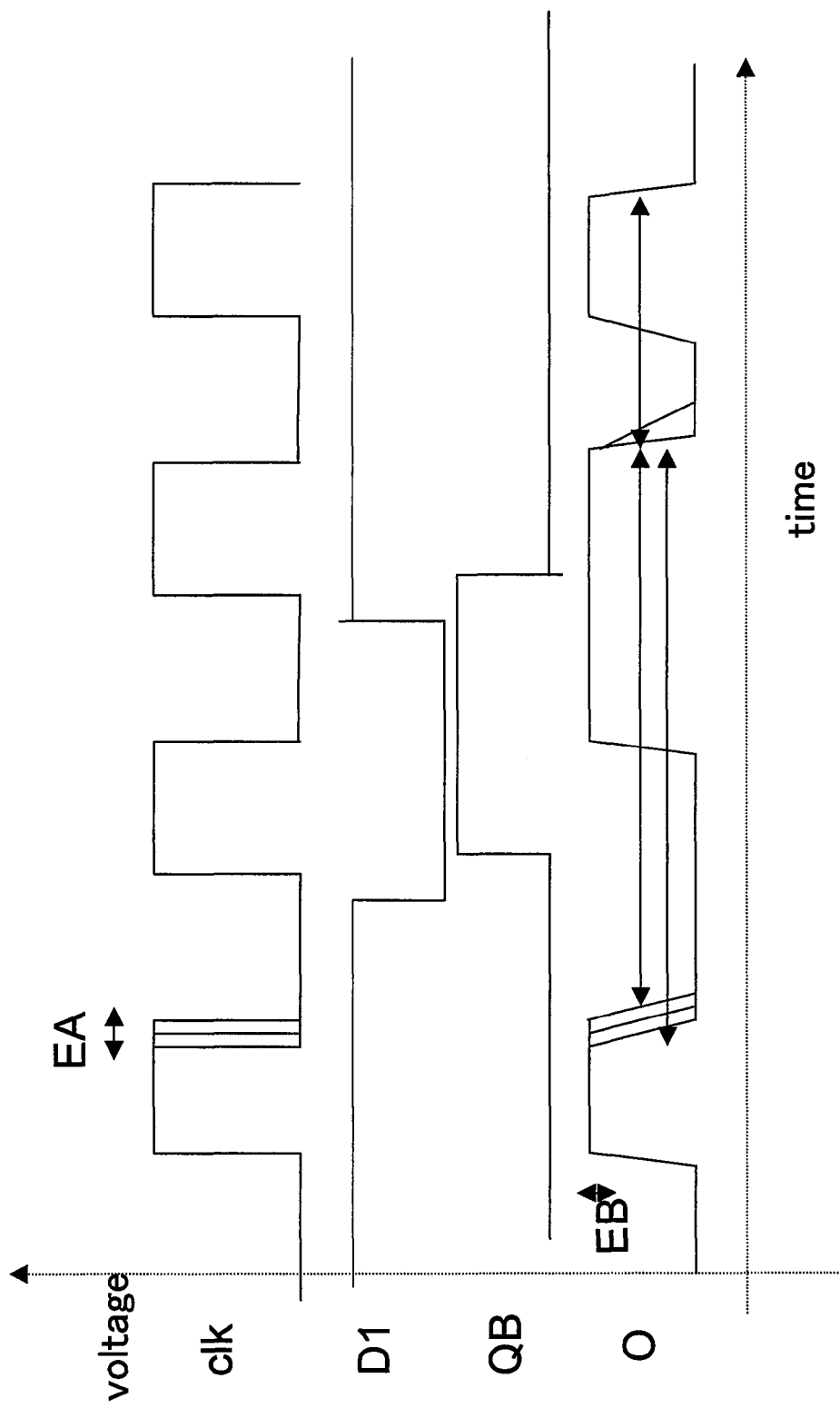
FIG. 22 is a timing chart of the transmitting circuit according to the preferred embodiment.

FIG. 22 is a timing chart. A horizontal axis denotes time, while a vertical axis denotes the clock CLKA, inversion output QB of the D1 flip-flop 5E3 and output O of the transition time adjusting circuit 24. The frequency of the output O of the transition time adjusting circuit 24 is different depending on the data pattern of D1 and the Duty ratio of the clock CLKA.

In the examples shown in FIGS. 16-21, the transition time adjusting circuit 24 is incorporated into the signal wire circuit 10. FIG. 23 shows a transition time adjusting circuit 24E which is still another example of the transition time adjusting circuit 24. The transition time adjusting circuit 24E adjusts the sensitivity of the receiving circuit 13 in the signal wire, and further, adjusts a bias voltage value of a gate electrode G of a power supply of the differential circuit. The amplifying circuit 12 of the signal wire circuit 10 may be adjusted by the transition time adjusting circuit 24E in a similar adjusting method. As a result, the effect which is further improved can be exerted.

Two MOS transistors shown in FIG. 23 in which the signal wire of the receiving circuit 13 is connected to gates can adjust the substrate voltages of the respective MOS transistors according to the layout described in detail referring to FIGS. 3 and 11. Accordingly, the variability of the differential pair transistors can be corrected. Referring to the correction, when the output from the receiving circuit is inputted to a CMP 31 and the output of the receiving circuit inputted thereto is different to the expectation value, TC is controlled by the mode control circuit 25 via the transition time adjusting circuit 24. The control of TC as used herein is to control the voltage values of the substrate contacts on both ends of the differential pair transistors.

Figure 24:
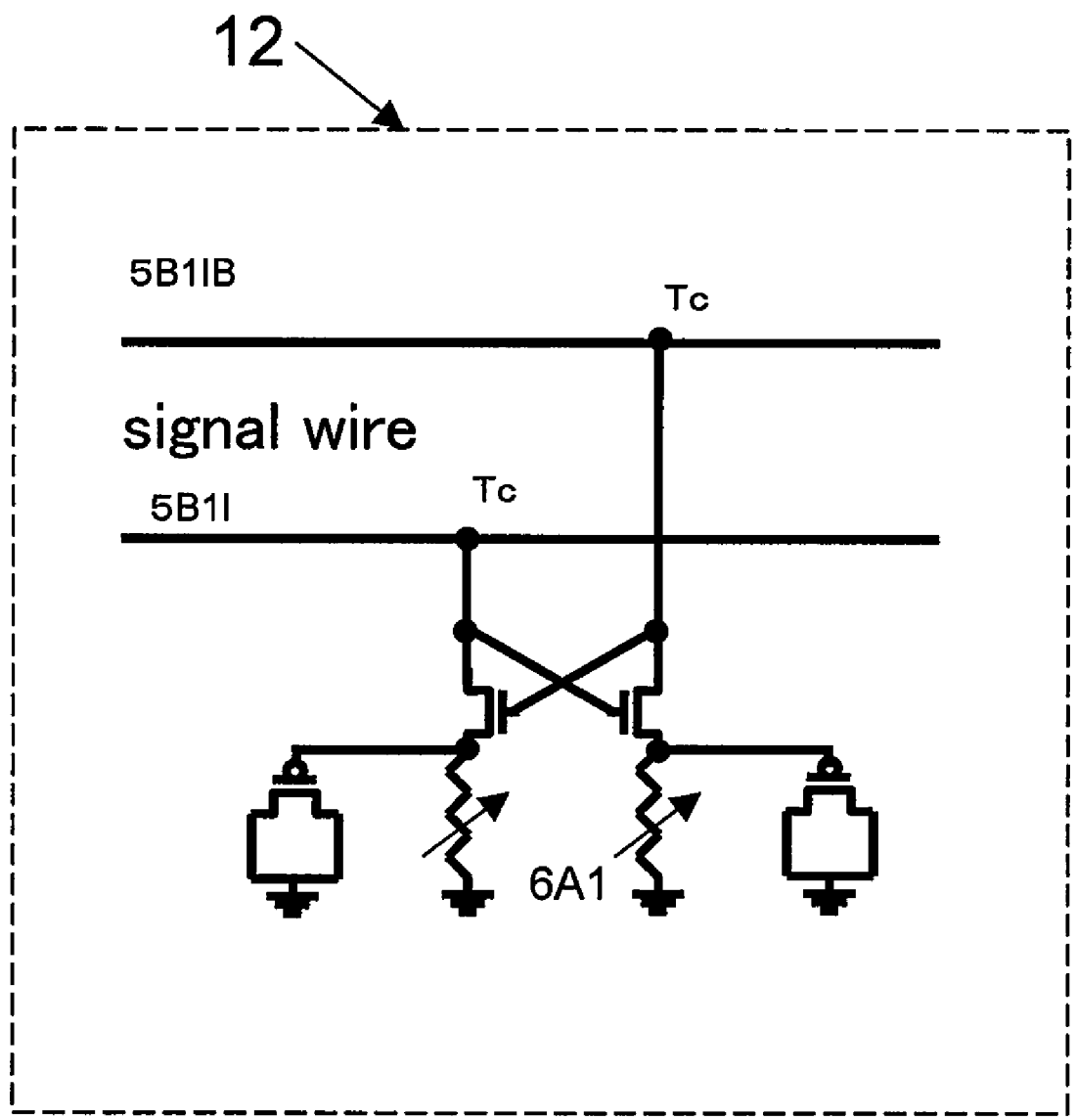
FIG. 24 shows an example of an amplifying circuit according to the preferred embodiment.

FIG. 24 is a drawing showing details of the amplifying circuit 12. A PMOS gate capacitance and a variable resistance 6A1 are connected to the pair of NMOS transistors and sources of NMOS which are connected to the pair of differential signal wires 5B1I and 5B1IB in the cross-coupling manner. The variable capacitance 6A1 is controlled in accordance with the detection result of the transition time detecting circuit 23. Accordingly, the impedance of the amplifying circuit 12 can be changed.

FIG. 25 is another drawing showing details of the amplifying circuit 12. The pair of differential signal wires 5B1I and 5B1IB are connected to the drains of the NMOS transistors in which E2[1:2] are connected to gates, and the drains of the NMOS connected in the cross-coupling manner are connected to the sources of the same NMOS transistors. The variable resistance 6A1 is controlled in accordance with the detection result of the transition time detecting circuit 23. E1[1:2] and E2[1:2] are also controlled in accordance with the detection result of the transition time detecting circuit 23, and the impedance of the amplifying circuit 12 can be more flexibly changed. Accordingly, the transition time is adjusted. When the data is transferred at a low speed, the potentials of E1[1:2] and E2[1:2] are set to 0. As a result, the conventional CMOS interface can be realized, and the power consumption can be thereby reduced.

Figure 26:
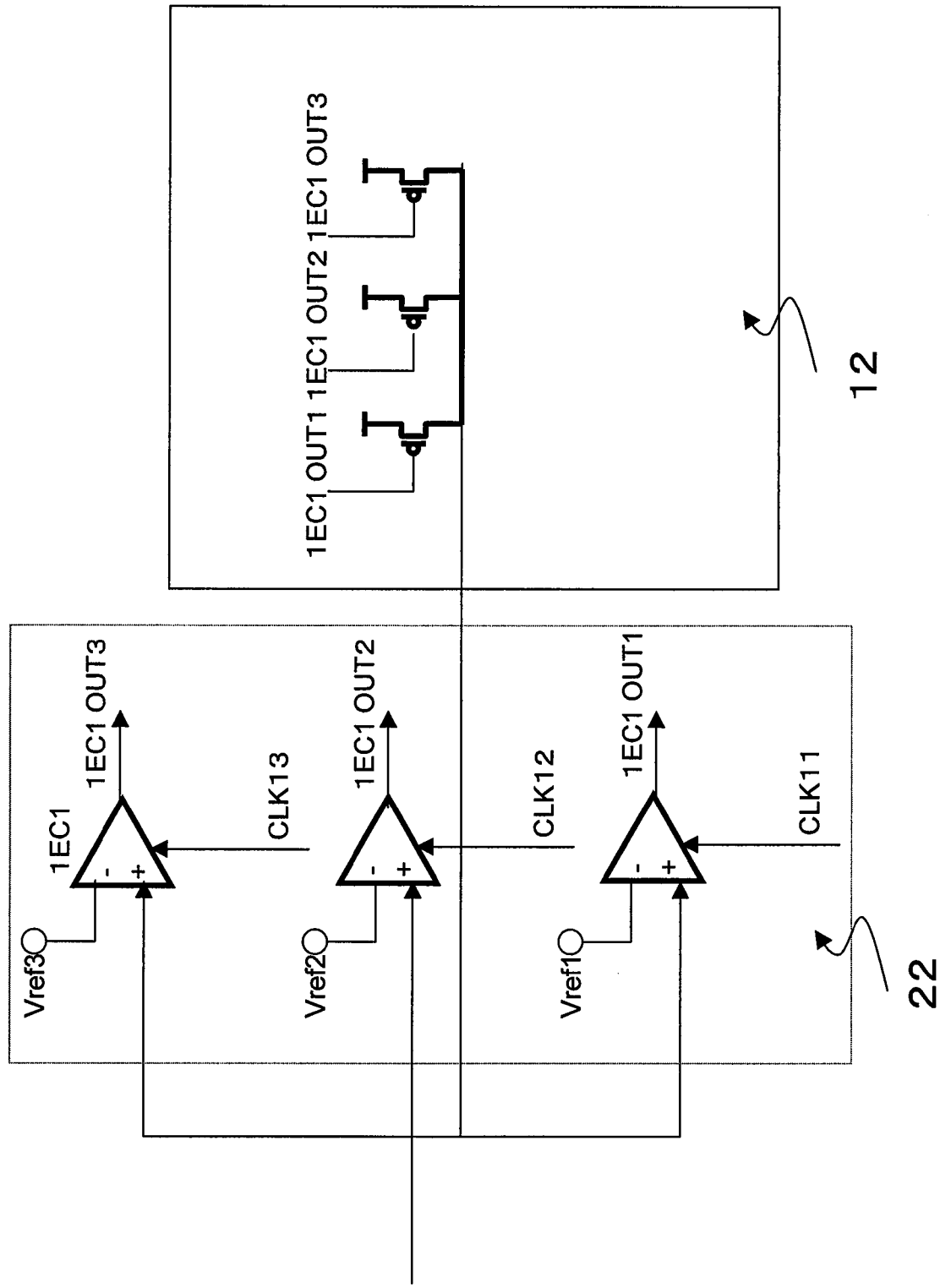
FIG. 26 shows an example in which the voltage level detecting circuit according to the preferred embodiment directly corrects the amplifying circuit.

FIG. 26 shows an example in which the amplifying circuit 12 is directly corrected by the voltage level detecting circuit 21. The voltage level detecting circuit 21 is configured in the same manner as shown in FIG. 9, wherein the clocks clk11, clk12 and clk13, and the reference voltages vref1, vref2 and vref3 are set according to the same method. Outputs OUT[3:1] of amplifying circuits 1E1C1 of the voltage level detecting circuit 21 are connected to the gates of the respective PMOS transistors of the amplifying circuits 12. In the transition of the signal wire from the "L" level to the "H" level according to the constitution, the current is amplified by the PMOS transistors in the amplifying circuit 12 when the potential level of the signal wire cannot be obtained within a certain period of time. A similar method is applicable when the signal wire transits from the "H" level to the "L" level, which can be easily assumed. This method can also be applied to the transmitting circuit 11 and the receiving circuit 13.

FIG. 27 shows a transition time adjusting circuit 24F which is still another example of the transition time adjusting circuit 24. The transition time adjusting circuit 24F adjusts the resistance value of the signal wire. More specifically, the transition time adjusting circuit 24F adjusts the resistance value by adjusting the number of resistances connected in parallel by a switch. When the resistance value and the capacitance value of the signal wire are both adjusted by the transition time adjusting circuit 24F, a width of the adjustment can be extended, and the transition of the signal wire can be accurately corrected.

Figure 28:
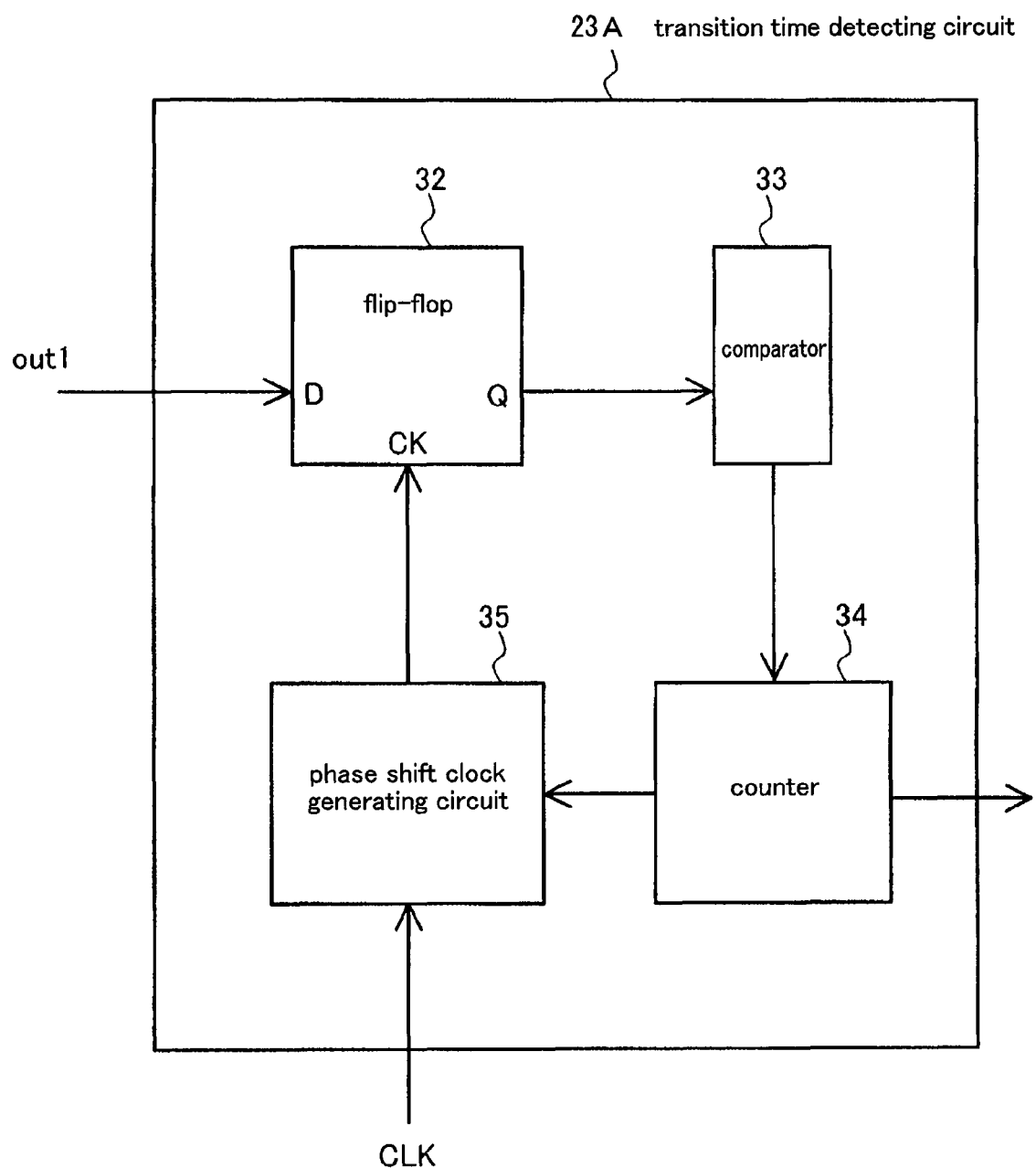
FIG. 28 is a circuit diagram illustrating an example of a transition time detecting circuit according to the preferred embodiment.

FIG. 28 shows a transition time detecting circuit 23A which is an example of the transition time detecting circuit 23. The transition time detecting circuit 23A comprises a phase shift clock generating circuit 35 for generating clocks having phases different to each other, a flip-flop 32 for retaining the information of the voltage level detecting circuits 21 and 22 by the clocks having the phases different to each other, a comparator 33 for comparing the information from the flip-flop 32 to an expectation value, and a counter 34. The transition time detecting circuit 23A causes clocks to be generated in increasing order of phase difference, and outputs the time information when the information is consistent with the expectation value.

In other words, FIG. 28 shows an example in which only QP1 of the voltage level detecting circuit 21 shown in FIG. 1 is used. Before the first clock is inputted to the flip-flop 32, the source voltage of the NMOS transistor QN1 is set to the ground, and the source voltage of the PMOS transistor QP1 is set to VDD/2. Then, the signal wire is activated, the clock is inputted to the flip-flop 32, an output Q of the flip-flop 32 is compared to the expectation value in the comparator 33, the counter 34 is decremented when the output Q is consistent with the expectation value, the clock is made ready to be minus-shifted by a defined clock phase difference in the phase shift clock generating circuit 35, and the clock is minus-shifted by the defined clock phase difference in the phase shift clock generating circuit 35. The foregoing operation is repeated until the output Q is inconsistent with the expectation value. A state value immediately before the inconsistency is detected is retained in the counter 34. The value is referred to as T1.

Next, the source voltage of the NMOS transistor QN1 is set to VDD/2−Vt in advance. The source voltage of the PMOS transistor QP1 is set to VDD−Vt. Then, the signal wire is activated, the clock is inputted to the flip-flop 32, the output Q of the flip-flop 32 is compared to the expectation value in the comparator 33, and the counter 34 is decremented when the output Q is consistent with the expectation value. The foregoing operation is repeated until the output Q is inconsistent with the expectation value. The state value immediately before the detection of the inconsistency is retained in the counter 34. The value is referred to as T2.

Next, the source voltage of the NMOS transistor QN1 is set to VDD−Vt in advance. The source voltage of the PMOS transistor QP1 is set to 3VDD/2−Vt. Then, the signal wire is activated, the clock is inputted to the flip-flop 32, the output Q of the flip-flop 32 is compared to the expectation value in the comparator 33, and the counter 34 is decremented when the output Q is consistent with the expectation value. The foregoing operation is repeated until the output Q is inconsistent with the expectation value. The state value immediately before the detection of the inconsistency is retained in the counter. The value is referred to as T3.

These values T1, T2 and T3 are inputted to the transition time adjusting circuit 24 from the counter 34. A difference obtained from T2−T1 denotes the value of the tilt of the waveform when the signal wire is up to 0V−>VDD/2, a difference obtained from T3−T2 denotes the value of the tilt of the waveform when the signal wire is up to VDD/2>VDD, and a difference obtained from T3−T1 denotes the value of the tilt of the waveform when the signal wire is up to 0−>VDD. When these values are small, TC is controlled in the transition time adjusting circuit 24 so that the waveform of the signal wire is moderate. When these values are large, TC is controlled in the transition time adjusting circuit 24 so that the waveform of the signal wire is steep. The operations described above are repeated so that the tilt of the signal waveform shows a desired value.

In the case where the accuracy can be low and the required tilt of the waveform is at most a certain degree, the signal wire is activated after the MOS transistors QP1 and QN1 of the voltage level detecting circuit 21 are set to the power supply value. When the value of the output Q of the flip-flop 32 is consistent with the expectation value, the subsequent operation is implemented without the decrement of the counter 34. When the value of the output Q of the flip-flop 32 is different to the expectation value, TC is controlled in the transition time adjusting circuit 24 so that the waveform of the signal wire is steep. In the case where the waveform of a small amplitude is detected, the supply voltage of the voltage level detecting circuit 21 is adjusted.

FIG. 29 shows a transition time detecting circuit 23B which is another example of the transition time detecting circuit 23. The transition time detecting circuit 23B comprises a phase shift clock generating circuit 35 for generating clocks having phases different to each other, flip-flops 32 and 32 for retaining the outputs of the voltage level detecting circuits 21 and 22 by the clocks having the phases different to each other, comparators 33 and 33 for comparing the outputs of the flip-flops 32 and 32 to expectation values, and a computing element 36. According to the constitution, the clocks of which the phase difference is small are generated in increasing order of smaller phase difference, and the difference of the phase values when the expectation values of the comparators 33 and 33 are consistent with the outputs of the flip-flops 32 and 32 is computed in the computing element 36, and then, the result of the computation is outputted.

FIG. 29 shows the example in which a plurality of transistors in the transition time detecting circuit 21 shown in FIG. 1, which are the PMOS transistors QP1 and QP2, are used, wherein the tilt of the waveform can be detected with the smaller number of clocks than in the example shown in FIG. 8. A fixed potential is applied to the sources of the PMOS transistors QP1 and QP2 in advance, and then, the signal wire is activated. The phase shift clock generating circuit 35 supplies the clocks having various phases to the flip-flops 32 and 32. The outputs Q of the flip-flops 32 is compared to data in the comparators 33, and results of the comparison to the expectation values are computed in the computing element 36. When the comparison results are both consistent with the expectation values, the phase difference of the clocks supplied to the flip-flops 32 is reduced by a defined clock phase difference in the phase shift clock generating circuit 35. When the respective expectation values are different from each other in the computing element 36 after the foregoing operations are repeated, the phase difference immediately before that is judged to be the tilt of the waveform. When these values are small, TC is controlled in the transition time adjusting circuit 24 so that the waveform of the signal wire is moderate. When these values are large, TC is controlled in the transition time adjusting circuit 24 so that the waveform of the signal wire is steep. In the case where the accuracy can be low and the required tilt of the waveform is at most a certain degree, the phase difference of the clocks supplied to the flip-flops 32 is generated in the phase shift clock generating circuit 35 by the defined clock phase difference. When the expectation values are different from each other in the computing element 36, TC is controlled in the transition time adjusting circuit 24 so that the waveform of the signal wire is steep. As such, a simplified method may be employed.

Figure 30:
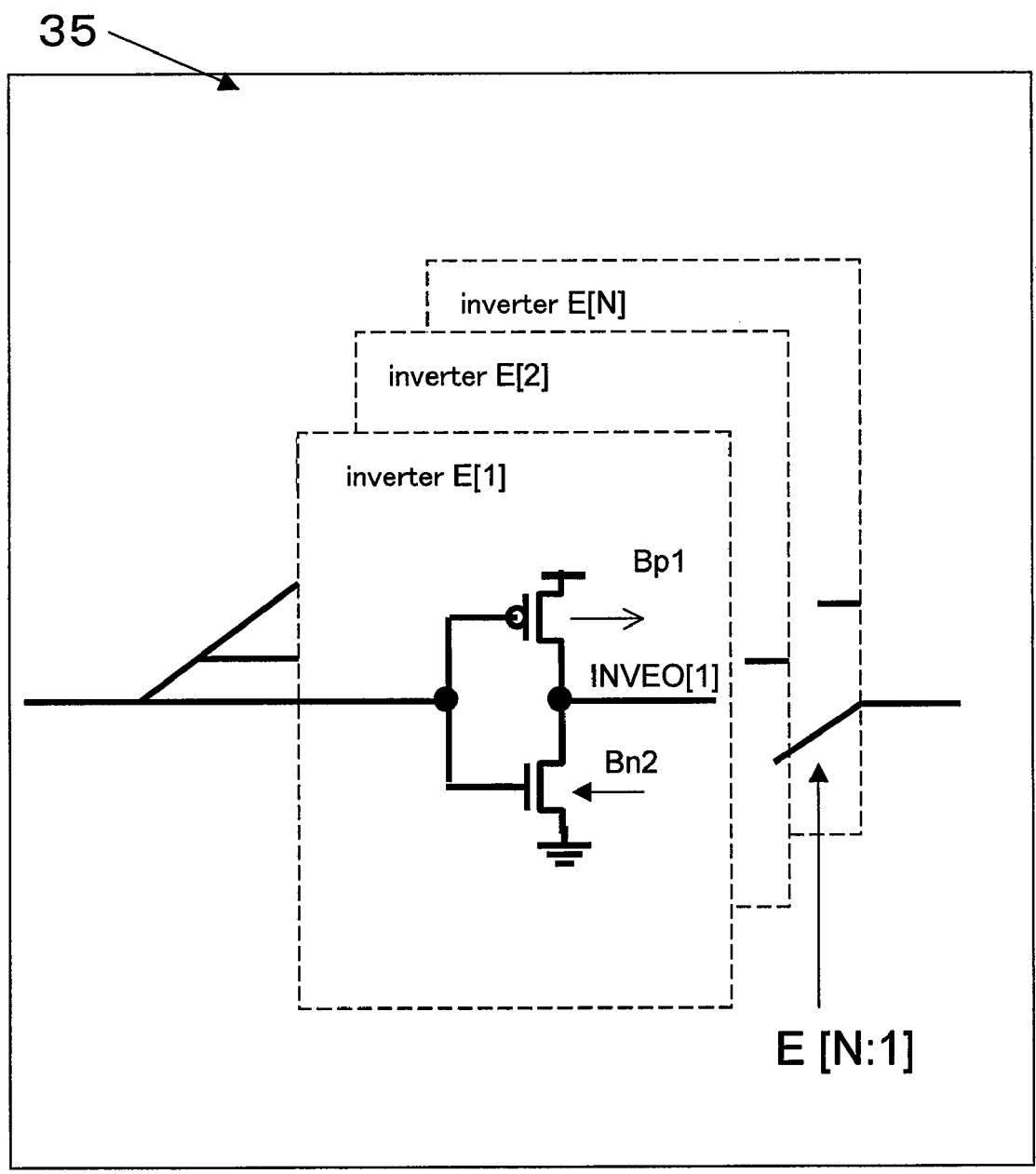
FIG. 30 shows an example of a phase shift clock generating circuit according to the preferred embodiment.

FIG. 30 shows an example of a circuit for outputting the clocks having the different phases from the phase shift clock generating circuit 35. First, a value from a counter is decoded, and outputs of inverters E[1:n] are switched by control signals of E[1:N]. In the respective inverters E, the NMOS and PMOS transistors have the same size; however, their substrate voltages BN and BP are different, which means that delay values of the respective inverters E are different depending on the substrate voltages. In the inverters E, the different delay values can be realized despite the same transistor shape. Therefore, the constitution is advantageously characterized in that it is hardly affected by the transistor variability due to the miniaturizing process.

Figure 31:
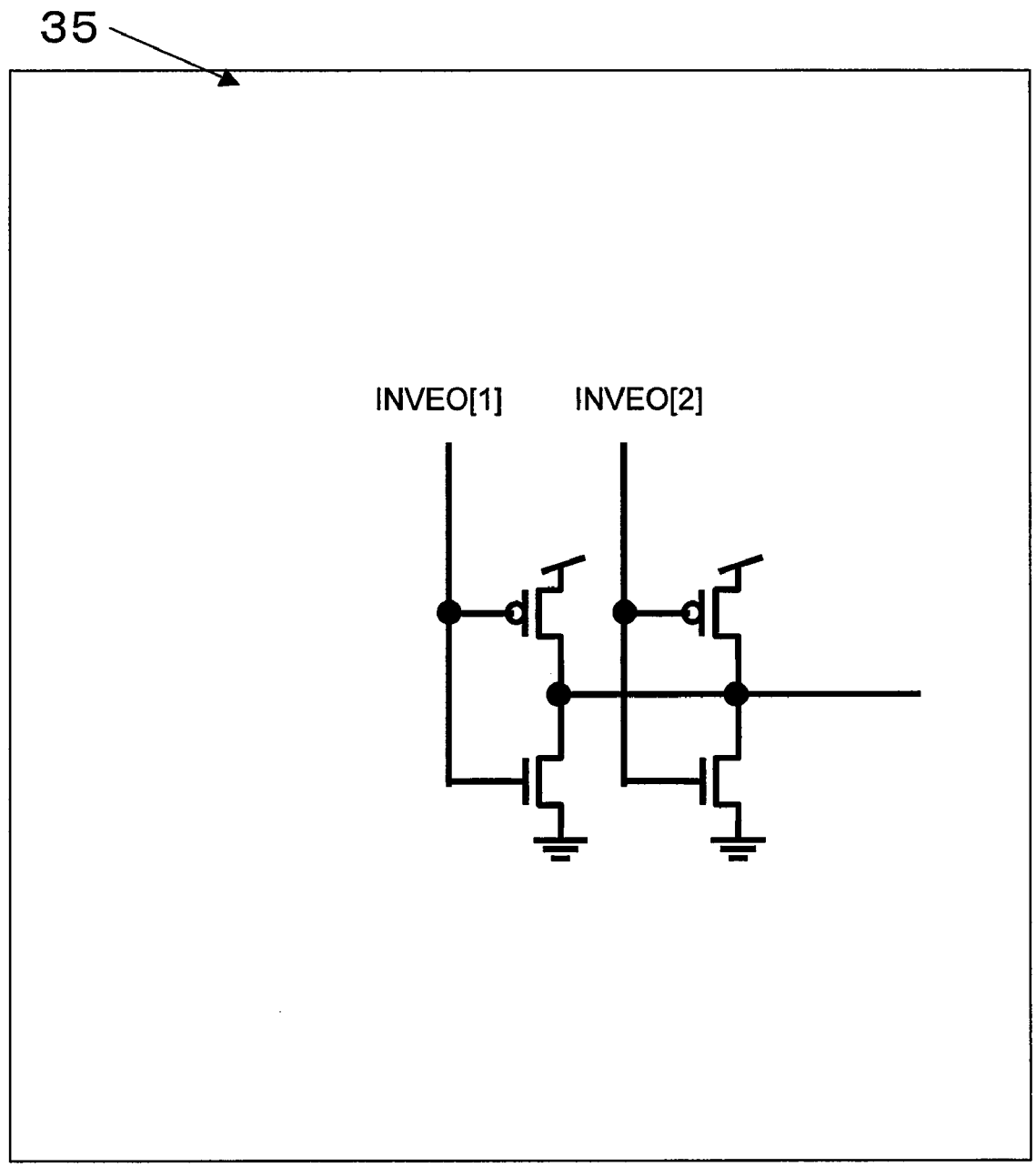
FIG. 31 shows an example of the phase shift clock generating circuit according to the preferred embodiment.

FIG. 31 shows an example of a circuit for generating an intermediate value of the output phase difference between the inverters E[1] and E[2]. When the circuit thus configured is used, the phase shift clock with a higher accuracy can be generated.

Figure 32:
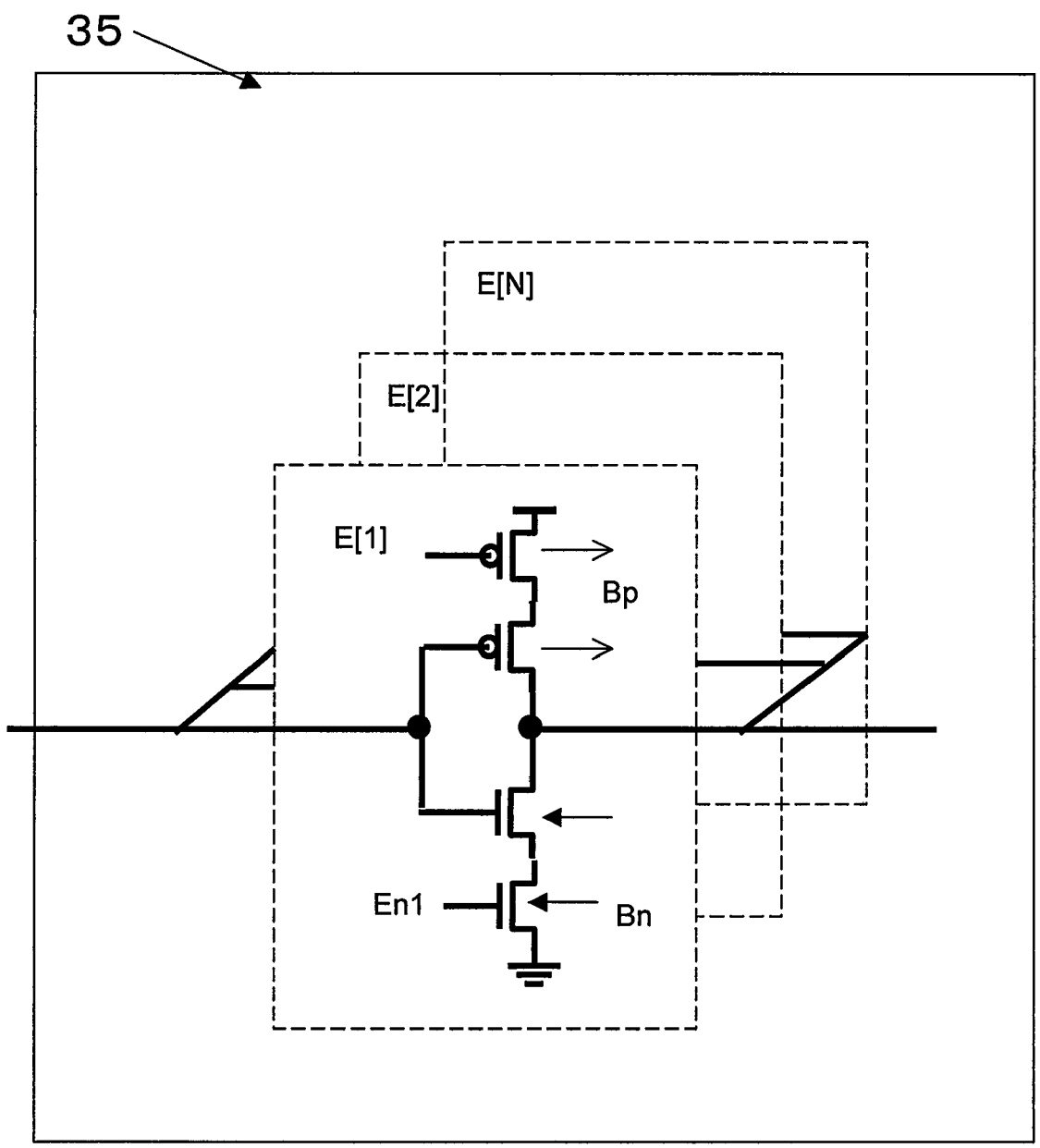
FIG. 32 shows an example of the phase shift clock generating circuit according to the preferred embodiment.

FIG. 32 shows another example of the circuit for outputting the clocks having the different phases from the phase shift clock generating circuit 35. The constitution shown in the drawing is different to that of FIG. 30 in that tristate inverters E1 are provided in place of the inverters E. The value from the counter is decoded, and outputs of the tristate inverters E1[1:N] are switched by the control signals of E[1:N]. In the respective tristate inverters E1, the NMOS and PMOS transistors have the same size; however, their substrate voltages BN and BP are different.

Figure 33:
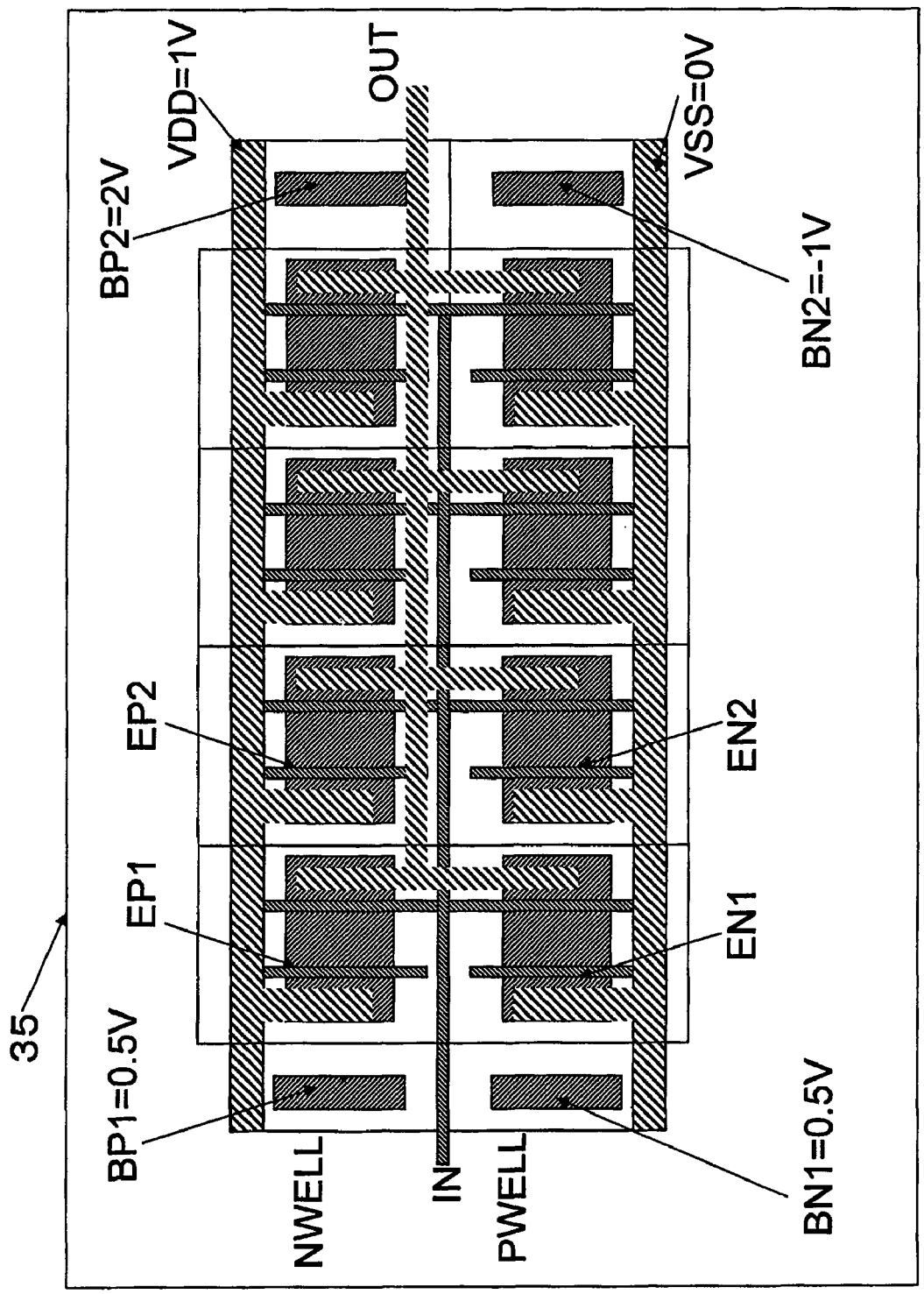
FIG. 33 shows a layout example of the phase shift clock generating circuit according to the preferred embodiment.

FIG. 33 is a layout drawing of the circuit shown in FIG. 31. The substrate taps of the respective MOS transistors are placed on both ends of the respective tristate inverters E1, and different voltages are applied to BP1, BP2, BN1 and BN2. The substrate voltage of each MOS transistor is set by a substrate resistance between BN1 and BN2. Such a layout design makes it possible to adjust the substrate voltage without the separation of the NWELL and PWELL. Therefore, a layout area can be reduced.

The transition time detecting circuit 23 may compare a voltage difference of the information from the voltage level detecting circuits 21 and 22 to a reference voltage value. Accordingly, the tilt of the waveform of the signal wire can be accurately detected in a simplified constitution.

The signal wire may be a clock signal wire of the semiconductor integrated circuit 1. Accordingly, the overhead of an operation frequency of the semiconductor integrated circuit 1 due to the clock skew can be reduced.

The signal wire may be a bus line. Accordingly, a high-speed transmission can be realized in the bus, and the latency (transmission delay) of the semiconductor integrated circuit 1 can be reduced.

The signal correction according to the present invention thus described may be implemented only when the value of the signal received by the receiving circuit 13 is found by the comparing circuit 31 to be any value other than the expectation value. Accordingly, the respective functional elements are operated only when necessary, which reduces the power consumption. In this constitution, it is desirable to correct the expectation value and transmit it to the functional circuit 26.

The signal may be corrected when the semiconductor integrated circuit 1 is subjected to a shipping inspection so that the information from the respective functional elements is stored in a memory device. Accordingly, any factor which may lead to the deterioration of a yielding percentage can be removed in advance.

The signal correction according to the present invention thus described may be implemented only when the operation frequency of the signal wire shows at least an arbitrary value. Accordingly, the signal correction according to the present invention can be implemented only when the timing is critical in the high-speed transmission, and the power consumption can be thereby reduced.

The signal correction according to the present invention thus described may be implemented only when the operation frequency of the signal wire shows at most an arbitrary value. Accordingly, the delay time can be adjusted up to the time in front of the time limit specified by timing restrictions in the low-speed transmission, and the voltage amplitude of the signal wire can be kept low. As a result, the power consumption can be further reduced.

The signal correction according to the present invention thus described may be implemented at arbitrary periods after the shipment of the semiconductor integrated circuit 1. Accordingly, the deterioration of the accuracy in the signal waveform over time in each circuit in relation to the signal wire can be corrected. Because the signal correction according to the present invention thus described may be implemented only in an arbitrary short period which is intermittently designated during the actual use of the semiconductor integrated circuit 1, the power consumption can be further reduced.

The signal correction according to the present invention thus described may be implemented only when the temperature of the signal wire shows at least an arbitrary value. Accordingly, the resistance causing the deterioration of the characteristic of the signal wire and the tilt of the signal waveform of the signal wire generated by the influence of the transmitting circuit 11, which may be generated in a high-temperature environment, can be accurately detected. When the signal correction according to the present invention thus described is halted at a certain temperature or below, the power consumption can be reduced.

The signal correction according to the present invention thus described may be implemented only when the temperature of the signal wire shows at most an arbitrary value. Accordingly, the resistance possibly sharpening the characteristic of the signal wire and abnormal transition of the signal waveform resulting from the influence of the transmitting circuit 11, which may be generated at a low temperature, can be accurately detected. Further, the power consumption can be reduced when the correction is halted at more than a particular temperature.

The signal correction according to the present invention thus described may be implemented only when an amplitude voltage of the signal wire shows at least an arbitrary value. Accordingly, the resistance possibly sharpening the characteristic of the signal wire and abnormal transition of the signal waveform resulting from the influence of the transmitting circuit 11, which may be generated at a high voltage, can be accurately detected. Further, the power consumption can be reduced when the correction is halted at a particular voltage or below.

The signal correction according to the present invention thus described may be implemented only when the amplitude voltage of the signal wire is at most an arbitrary value. Accordingly, the resistance possibly causing the deterioration of the characteristic of the signal wire and the tilt of the signal waveform resulting from the influence of the transmitting circuit 11, which may be generated at a low voltage, can be accurately detected. Further, the power consumption can be reduced when the correction is halted at more than a particular voltage. Further, any influence from power supply noise of the transmitting and receiving circuits can be reduced. The power supply noise may be possibly increased because the circuits for implementing the signal correction according to the present invention are provided.

The signal correction according to the present invention thus described may be implemented only when the activation rate of the signal wire is at least an arbitrary value. Accordingly, the tilt of the signal waveform of the signal wire can be accurately detected. Further, the power consumption can be reduced when the correction is halted when the activation rate is below the particular value.

The signal correction according to the present invention thus described may be implemented only when the functional block relating to the signal wire starts its operation. As a result, signal correction operations according to the present invention can be halted whenever they are unnecessary, and the power consumption can be thereby reduced.

The respective circuit elements for realizing the signal correction according to the present invention are preferably powered off when halted. As a result, the leakage of the current from these circuit elements can be prevented, and the power consumption can be thereby reduced.

The respective circuit elements for realizing the signal correction according to the present invention preferably retain the detected values when halted. As a result, the correction information can be transmitted to the transition time adjuster even when these circuit elements are halted, and the power consumption in the transition time adjuster can be reduced.

When the semiconductor integrated circuit 1 is subjected to the shipping inspection, the set voltage values and the information of the output wire OUT1 and the like for realizing the signal correction according to the present invention are preferably transmitted to the test/mode control circuit 25 and compared to the expectation values therein, and the comparison result is preferably transmitted to an external test device via the PAD. Accordingly, the signal correction can be more accurate because the respective circuit elements for realizing the signal correction according to the present invention are subjected to the inspection or trimming control.

In the case where the receiving circuit 13 is adjusted by the signal correction according to the present invention, the transition time adjusting circuit 24 is preferably provided in the vicinity of the receiving-circuit-13 side. Accordingly, the instruction for the correction of the receiving circuit 13 can be speedily transmitted. Further, the area overhead of the signal wire can be reduced, which leads to the reduction of the power consumption.

In the case where the transmitting circuit 14 is adjusted by the signal correction according to the present invention, the transition time adjusting circuit 24 is preferably provided in the vicinity of the transmitting-circuit-14 side. Accordingly, the instruction for the correction of the transmitting circuit 14 can be speedily transmitted. Further, the area overhead of the signal wire can be reduced, which leads to the reduction of the power consumption.

The power supply voltages of the respective circuit elements for realizing the signal correction according to the present invention are preferably equal to the power supply voltages of the transmitting and receiving circuits 11 and 13. Accordingly, the area overhead of the power supply line exclusively used for these circuit elements can be reduced, which facilitates the physical layout design.

Figure 34:
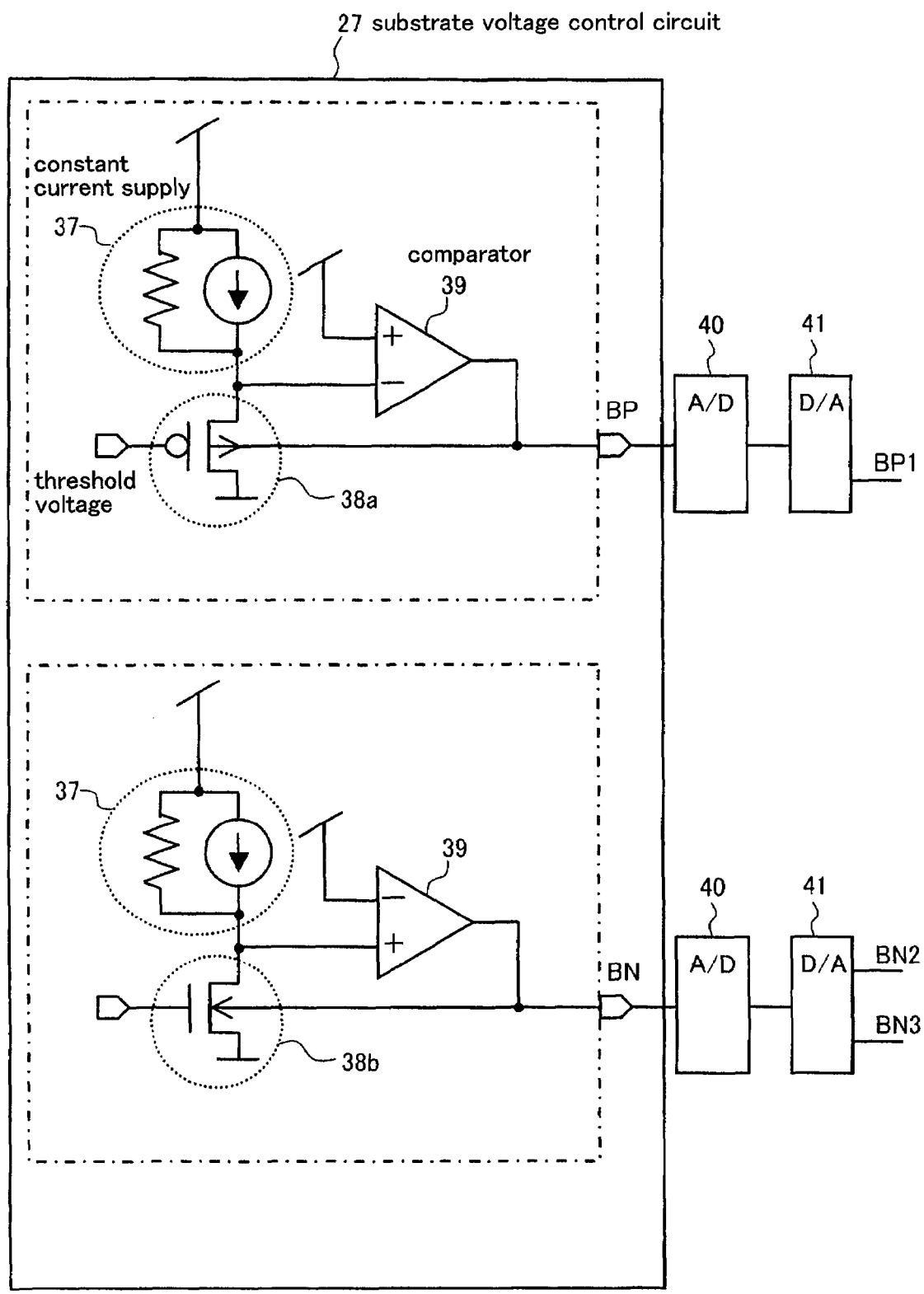
FIG. 34 is a circuit diagram illustrating an example of a substrate voltage control circuit according to the preferred embodiment.

The output voltage of the substrate voltage control circuit 27 for supplying the substrate voltage to the functional block is preferably used as the substrate voltages of the voltage level detecting circuits 21 and 22, which corresponds to a circuit configuration shown in FIG. 34. In FIG. 34, 37 denotes a constant current supply, 38a denotes a PMOS transistor for controlling the substrate voltage, 38b denotes an NMOS transistor for controlling the substrate voltage, 39 denotes a comparator, 40 denotes an A/D converter, and 41 denotes a D/A converter.

The substrate voltages BP and BN from the substrate voltage control circuit 27 are A/D-converted by the A/D converter 40, and further, D/A-converted by the D/A converter 41 so that they are converted into the substrate voltages of the respective MOS transistors. Accordingly, the area overhead of the substrate voltage control circuit and the substrate signal wire line exclusively used for these circuit elements can be reduced, which leads to the reduction of the power consumption.

Figure 35:
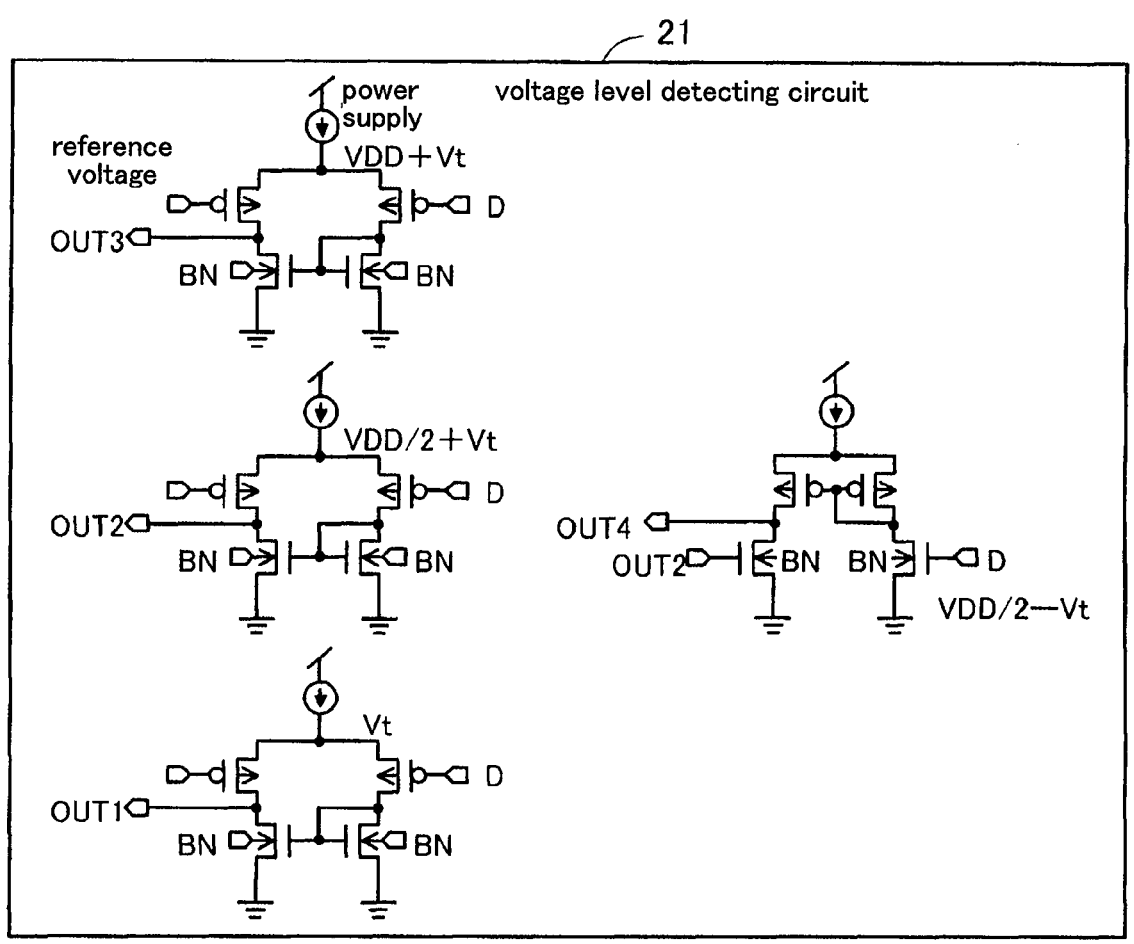
FIG. 35 is a circuit diagram illustrating another example of the voltage level detecting circuit according to the preferred embodiment.

FIG. 35 shows another voltage level detecting circuit 21, which is an operational amplifier circuit comprising CMOS transistors.

INDUSTRIAL APPLICABILITY

The semiconductor integrated circuit according to the present invention is useful as a semiconductor chip comprising a CPU, and is also applicable to a chip set in which the chip is used, a mobile telephone, an IC card chip and the like. An electronic product provided with the semiconductor integrated circuit according to the present invention is advantageous in its environment-friendliness.

What is claimed is:

1. A semiconductor integrated circuit comprising:
a signal wire; and
a voltage level detector for detecting a voltage level of the signal wire,
wherein:
the voltage level detector detects the voltage level of the signal wire during a transition period during which the signal wire changes from an inactive voltage state to an active voltage state based on the voltage level detected by the voltage detector,
the voltage level detector comprises at least a first NMOS transistor and a first PMOS transistor,
the signal wire is connected to a gate of the first NMOS transistor, a first voltage is connected to a source of the first NMOS transistor, a drain of the first NMOS transistor is connected to a drain of the first PMOS transistor, a clock is inputted to a gate of the first PMOS transistor, a second voltage is connected to a source of the first PMOS transistor,
a voltage larger than the first voltage is set to the drain of the first NMOS transistor prior to the transition period during which the signal wire changes from the inactive voltage state to the active voltage state, and
the voltage level detector detects the drain voltage of the first NMOS transistor during the transition period.

2. The semiconductor integrated circuit as claimed in claim 1, further comprising a transition time detector for detecting a time length of the transition period during which the signal wire changes from an inactive voltage state to an active voltage state based on the voltage level detected by the voltage detector, wherein
the signal wire transition time detector detects the time length of the transition period based on the drain voltage detected by the voltage level detector.

3. The semiconductor integrated circuit as claimed in claim 2, wherein
the transition time detector further judges whether or not a reverse transition is generated during the transition period based on the voltage level detected by the voltage level detector.

4. The semiconductor integrated circuit as claimed in claim 2, wherein
a substrate voltage of the first NMOS transistor is set so that a threshold value thereof shows a desired value.

5. The semiconductor integrated circuit as claimed in claim 4, wherein
the substrate voltage value of the first NMOS transistor is set by a substrate voltage value supplied from substrate contacts sandwiching the first NMOS transistor on a well on which the transistor is formed.

6. The semiconductor integrated circuit as claimed in claim 4, further comprising a substrate voltage controller for supplying a substrate voltage to a functional block relating to the signal wire, wherein
an output voltage of the substrate voltage controller is used as the substrate voltage of the MOS transistor.

7. The semiconductor integrated circuit as claimed in claim 2, wherein
the voltage level detector comprises:
a second PMOS transistor in which a second voltage is set to its source, a voltage lower than the second voltage is set to its drain before the transition period starts, and the signal wire is connected to its gate; and
a second NMOS transistor in which the drain of the second PMOS transistor is connected to its drain and the drain of the first NMOS transistor is connected to its gate, wherein:
the voltage level detector detects the drain voltage of the second PMOS transistor during the transition period, and
the transition time detector detects the time length of the transition period based on the drain voltage of the second PMOS transistor detected by the voltage level detector and judges whether or not a reverse transition is generated during the transition period.

8. The semiconductor integrated circuit as claimed in claim 7, wherein
a substrate voltage of the second PMOS transistor is set so that a threshold value thereof shows a desirable value.

9. The semiconductor integrated circuit as claimed in claim 8, further comprising a substrate voltage controller for supplying a substrate voltage to a functional block relating to the signal wire, wherein
an output voltage of the substrate voltage controller is used as a substrate voltage of the MOS transistor.

10. The semiconductor integrated circuit as claimed in claim 2, wherein
a substrate voltage of the first NMOS transistor is controllable.

11. The semiconductor integrated circuit as claimed in claim 10, further comprising a substrate voltage controller for supplying a substrate voltage to a functional block relating to the signal wire, wherein
an output voltage of the substrate voltage controller is used as a substrate voltage of the MOS transistor.

12. The semiconductor integrated circuit as claimed in claim 2, further comprising a transition time adjuster for adjusting a transition time of a signal waveform of the signal wire based on a result of the detection by the transition time detector.

13. The semiconductor integrated circuit as claimed in claim 12, wherein
the transition time adjuster adjusts the transition time by adjusting an inductance value of the signal wire.

14. The semiconductor integrated circuit as claimed in claim 12, wherein
the transition time adjuster adjusts the transition time by adjusting a capacitance of the signal wire.

15. The semiconductor integrated circuit as claimed in claim 12, wherein
the transition time adjuster adjusts the transition time by adjusting a terminal resistance of a receiver of the signal wire.

16. The semiconductor integrated circuit as claimed in claim 15, wherein
the terminal resistance of the receiver of the signal wire is cut off when a transfer frequency of the signal wire shows at most an arbitrary frequency value.

17. The semiconductor integrated circuit as claimed in claim 12, further comprising a transmission-side drive performance adjuster of the signal wire, wherein
the transition time adjuster adjusts the transition time by controlling the transmission-side drive performance adjuster.

18. The semiconductor integrated circuit as claimed in claim 17, further comprising a transmission-side drive comprising MOS transistors, wherein
the transmission-side drive performance adjuster adjusts the transition time by controlling a degree of parallelization of the MOS transistors.

19. The semiconductor integrated circuit as claimed in claim 18, wherein
the transmission-side drive performance adjuster controls a signal transfer time in accordance with a data transition state on the transmission side.

20. The semiconductor integrated circuit as claimed in claim 18, further comprising a transmission-side drive comprising resistances, wherein
the transmission-side drive performance adjuster adjusts the transition time by controlling resistance values of the resistances.

21. The semiconductor integrated circuit as claimed in claim 17, further comprising a transmission-side drive comprising MOS transistors, wherein
the transmission-side drive performance adjuster adjusts the transition time by controlling power supply voltage values of sources of the MOS transistors.

22. The semiconductor integrated circuit as claimed in claim 17, further comprising a transmission-side drive comprising MOS transistors, wherein
the transmission-side drive performance adjuster adjusts the transition time by controlling voltage values of substrates of the MOS transistors.

23. The semiconductor integrated circuit as claimed in claim 12, further comprising a receiver of the signal wire, wherein
the transition time adjuster adjusts the transition time by controlling a sensitivity of the receiver.

24. The semiconductor integrated circuit as claimed in claim 23, wherein
the receiver of the signal wire comprises:

a plurality of registers synchronizing with each other by a first clock;

a first counter for making a count by the first clock;

a second counter for fetching a value of the signal wire into one of the plurality of registers by an output of the first counter and making a count by a second clock; and a selector circuit for selecting one of outputs of the plurality of registers using the second counter, wherein an MSB value of the second counter is adjusted in accordance with a delay value of the signal wire.

25. The semiconductor integrated circuit as claimed in claim 23, wherein a differential circuit constitutes the receiver.

26. The semiconductor integrated circuit as claimed in claim 25, wherein the differential circuit comprises at least two MOS transistors in which their gates are connected to the signal wire, and substrate voltage values of the MOS transistors are set by substrate voltage values supplied from substrate contacts sandwitching the first and second NMOS transistors on wells on which the first and second NMOS transistors are formed.

27. The semiconductor integrated circuit as claimed in claim 12, further comprising an amplifier connected to the signal wire, wherein the transition time adjuster adjusts the transition time by controlling a sensitivity of the amplifier.

28. The semiconductor integrated circuit as claimed in claim 27, wherein the amplifier is cut off when a transfer frequency of the signal wire is at most an arbitrary frequency value.

29. The semiconductor integrated circuit as claimed in claim 12, wherein the transition time adjuster adjusts the transition time by controlling a resistance value of the signal wire.

30. The semiconductor integrated circuit as claimed in claim 12, wherein the transition time adjuster adjusts the transition time by controlling the product of a resistance value and a capacitance value of the signal wire.

31. The semiconductor integrated circuit as claimed in claim 2, wherein the transition time detector comprises:

a phase shift clock generator for generating clocks having phases different to each other;

an information retainer for retaining a result of the detection by the voltage level detector in synchronization with a clock generated by the phase shift clock generator; and a comparator for comparing the voltage level detection result retained by the information retainer to an expectation value.

32. The semiconductor integrated circuit as claimed in claim 31, wherein the phase shift clock generator comprises:

a plurality of inverters connected in parallel to each other; and a selecting circuit for switching outputs of the plurality of inverters by a control signal, wherein substrate voltage values of MOS transistors of the plurality of inverters are set by substrate voltage values supplied from substrate contacts sandwitching the respective MOS transistors on wells on which the MOS transistors are formed.

33. The semiconductor integrated circuit as claimed in claim 31, wherein the transition time detector comprises a computing element for computing a difference between results of the comparison by the comparator, and the transition time detector outputs information relating to a minimum phase difference in which the comparison result by the comparator is favorable.

34. The semiconductor integrated circuit as claimed in claim 2, wherein the signal wire is a clock signal wire.

35. The semiconductor integrated circuit as claimed in claim 2, wherein the signal wire is a bus line.

36. The semiconductor integrated circuit as claimed in claim 2, further comprising a receiver of the signal wire, wherein the voltage level detector, the transition time detector and the transition time adjuster execute the processing thereof after the receiver detects any value other than an expectation value.

37. The semiconductor integrated circuit as claimed in claim 2, further comprising a memory device for memorizing outputs of the voltage level detector, the transition time detector and the transition time adjuster, wherein the voltage level detector, the transition time detector and the transition time adjuster execute the processing thereof when the semiconductor integrated circuit is subjected to a shipping inspection and store results obtained from the respective processing in the memory device.

38. The semiconductor integrated circuit as claimed in claim 2, wherein the voltage level detector, the transition time detector and the transition time adjuster execute the processing thereof when an operation frequency of the signal wire is at least an arbitrary value.

39. The semiconductor integrated circuit as claimed in claim 2, wherein the voltage level detector, the transition time detector and the transition time adjuster execute the processing thereof when an operation frequency of the signal wire is at most an arbitrary value.

40. The semiconductor integrated circuit as claimed in claim 2, wherein the voltage level detector, the transition time detector and the transition time adjuster execute the processing thereof at arbitrary periods after the shipment of the semiconductor integrated circuit.

41. The semiconductor integrated circuit as claimed in claim 2, wherein the voltage level detector, the transition time detector and the transition time adjuster execute the processing thereof when a temperature of the semiconductor integrated circuit is at least an arbitrary value.

42. The semiconductor integrated circuit as claimed in claim 2, wherein the voltage level detector, the transition time detector and the transition time adjuster execute the processing thereof when a temperature of the semiconductor integrated circuit is at most an arbitrary value.

43. The semiconductor integrated circuit as claimed in claim 2, wherein the voltage level detector, the transition time detector and the transition time adjuster execute the processing thereof when an amplitude voltage of the signal wire is at least an arbitrary value.

44. The semiconductor integrated circuit as claimed in claim 2, wherein the voltage level detector, the transition time detector and the transition time adjuster execute the processing thereof when an amplitude voltage of the signal wire is at most an arbitrary value.

45. The semiconductor irate-grate integrated circuit as claimed in claim 2, wherein
the voltage level detector, the transition time detector and the transition time adjuster execute the processing thereof when an activation rate of the signal wire is at least an arbitrary value.

46. The semiconductor integrated circuit as claimed in claim 2, wherein
the voltage level detector, the transition time detector and the transition time adjuster execute the processing thereof when a functional block relating to the signal wire starts an operation thereof.

47. The semiconductor integrated circuit as claimed in claim 2, wherein
the voltage level detector, the transition time detector and the transition time adjuster are powered off when halted.

48. The semiconductor integrated circuit as claimed in claim 2, wherein
the voltage level detector retains a result of the detection by the voltage level detector when halted.

49. The semiconductor integrated circuit as claimed in claim 2, further comprising:
a pad for external connection; and
a detection result output wire for outputting a result of the detection by the voltage level detector, wherein
the detection result output wire is connected to the pad.

50. The semiconductor integrated circuit as claimed in claim 2, wherein
the voltage level detector, the transition time detector and the transition time adjuster each comprise a self-test function in the semiconductor integrated circuit.

51. The semiconductor integrated circuit as claimed in claim 2, further comprising a receiver of the signal wire, wherein
the voltage level detector, the transition time detector and the transition time adjuster adjust the receiver and are provided at a position near the receiver.

52. The semiconductor integrated circuit as claimed in claim 2, further comprising a transmitter of the signal wire, wherein
the voltage level detector, the transition time detector and the transition time adjuster adjust the transmitter and are provided at a position near the transmitter.

53. The semiconductor integrated circuit as claimed in claim 2, further comprising a transmitter/receiver of the signal wire, wherein
the voltage level detector, the transition time detector, the transition time adjuster, and the transmitter/receiver use a common power supply voltage.

54. A semiconductor integrated circuit comprising:
a signal wire;
a voltage level detector for detecting a voltage level of the signal wire; and
a transition time detector for detecting a time length of a transition period during which the signal wire changes from an inactive voltage state to an active voltage state based on the voltage level detected by the voltage detector, wherein:
the voltage level detector detects the voltage level of the signal wire during the transition period,
the voltage level detector comprises differential circuits,
each of the differential circuits compares a voltage difference between the voltage level of the signal wire and a reference voltage value,
a clock is inputted to each of the differential circuits,
different delay values are set in each clock inputted to the differential circuits, and
different voltage values are set in each reference voltage of the differential circuits.

* * * * *